United States Patent
Kim et al.

(10) Patent No.: US 10,497,891 B2
(45) Date of Patent: Dec. 3, 2019

(54) LIGHTING APPARATUS USING ORGANIC LIGHT-EMITTING DIODE

(71) Applicant: LG Display Co., Ltd., Seoul (KR)

(72) Inventors: Nam-Kook Kim, Paju-si (KR); Jung-Eun Lee, Paju-si (KR); Tae-Ok Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/031,396

(22) Filed: Jul. 10, 2018

(65) Prior Publication Data

US 2019/0019976 A1    Jan. 17, 2019

(30) Foreign Application Priority Data

Jul. 11, 2017  (KR) .................. 10-2017-0088045

(51) Int. Cl.
*H01L 51/52* (2006.01)
*H01L 51/00* (2006.01)
*H01L 51/56* (2006.01)

(52) U.S. Cl.
CPC ...... *H01L 51/5203* (2013.01); *H01L 51/0034* (2013.01); *H01L 51/0097* (2013.01); *H01L 51/5268* (2013.01); *H01L 51/5275* (2013.01); *H01L 51/56* (2013.01); *H01L 51/5212* (2013.01); *H01L 51/5228* (2013.01); *H01L 51/5237* (2013.01); *H01L 2251/5361* (2013.01)

(58) Field of Classification Search
CPC ............ H01L 51/5203; H01L 51/5237; H01L 51/0034; H01L 51/5275; H01L 51/0097; H01L 51/56
See application file for complete search history.

(56) References Cited

U.S. PATENT DOCUMENTS

2014/0027727 A1* 1/2014 Lee ..................... H01L 51/5281 257/40
2015/0144900 A1* 5/2015 Lee ..................... H01L 51/5268 257/40
2018/0175328 A1* 6/2018 Yoon ................... H01L 51/5206

FOREIGN PATENT DOCUMENTS

| KR | 10-2006-0042728 A | 5/2006 |
|---|---|---|
| KR | 10-2012-0106263 A | 9/2012 |
| KR | 10-2013-0036843 A | 4/2013 |
| KR | 10-2014-0143916 A | 12/2014 |
| KR | 10-2015-0037702 A | 4/2015 |

* cited by examiner

*Primary Examiner* — Dung A. Le
(74) *Attorney, Agent, or Firm* — Polsinelli PC

(57) ABSTRACT

A lighting apparatus using an organic light-emitting diode (OLED) of the present disclosure is characterized in that an inner light extraction layer is provided between a substrate and an OLED, and concurrently, a multi-buffer layer, of which a refractive index is gradually changed, is formed on the inner light extraction layer. According to the present disclosure, light extraction due to scattering may be improved by applying the inner light extraction layer, and a waveguide mode may be extracted as light by applying the multi-buffer layer, thereby improving luminous efficiency.

16 Claims, 19 Drawing Sheets

LIGHTING APPARATUS USING ORGANIC LIGHT-EMITTING DIODE

CROSS-REFERENCE TO RELATED APPLICATION

This application claims the benefit under 35 U.S.C. § 119(a) of Korean Patent Application No. 10-2017-0088045, filed on Jul. 11, 2017, in the Korean Intellectual Property Office, which is incorporated herein by reference in its entirety.

BACKGROUND

Field of the Disclosure

The present disclosure relates to a lighting apparatus, and more particularly, to a lighting apparatus using an organic light-emitting diode.

Description of the Background

Currently, a fluorescent lamp or an incandescent lamp is mainly used as a lighting apparatus. Among these, the incandescent lamp has a high color rendering index (CRI) but has low energy efficiency. The fluorescent lamp has high efficiency but has a low CRI and contains mercury to cause an environmental problem.

A CRI is an index for indicating ability to reproduce colors and indicating a degree of similarity between a sense of a color when an object is illuminated by a specific light source and a sense of a color when the object is illuminated by a reference light source. For example, a CRI of the sunlight is 100.

In order to solve such a problem of an existing lighting apparatus, recently, light-emitting diodes (LEDs) have been proposed as lighting apparatuses. LEDs are made of an inorganic light-emitting material. Luminous efficiency of LEDs is the highest in a blue wavelength range and is gradually lowered toward a red wavelength range and a green wavelength range, in which a green color has the highest spectral luminous efficacy. Thus, when white light is emitted by combining a red LED, a green LED, and a blue LED, luminous efficiency is lowered.

As other alternatives, lighting apparatuses using an organic light-emitting diode (OLED) are developed. Lighting apparatuses using a general OLED are manufactured as follows: an anode made of indium tin oxide (ITO) is formed on a glass substrate, an organic light-emitting layer and a cathode are formed, and a passivation layer and a lamination film as an encapsulation means are attached to an upper surface of the cathode.

Although lighting apparatuses using an OLED require high luminous efficiency (light extraction efficiency) and a long device lifetime, luminous efficiency is reduced due to generation of a waveguide mode caused by total internal reflection at an interface between layers. That is, as a waveguide mode proceeds and disappears to a side surface at an interface between a substrate and an OLED, luminous efficiency is reduced to about 40%.

SUMMARY

The present disclosure is contrived to solve the aforementioned problem and directed to providing a lighting apparatus using an organic light-emitting diode, which is capable of improving luminous efficiency and reliability by using an inner light extraction layer and a multi-buffer layer.

Features of the present disclosure will be described in the configuration of the disclosure and claims which follow herein below.

According to an aspect of the present disclosure, a lighting apparatus using an organic light-emitting diode includes an inner light extraction layer provided on a substrate, a multi-buffer layer provided on the inner light extraction layer, and a first electrode, an organic light-emitting layer, and a second electrode, which are provided in a lighting part of the substrate provided with the multi-buffer layer.

The multi-buffer layers may be configured such that a refractive index thereof is gradually changed between a refractive index of the inner light extraction layer and a refractive index of the first electrode.

The inner light extraction layer may include a first inner light extraction layer formed by dispersing first scattering particles each having a first size and second scattering particles each having a second size smaller than the first size in a resin and a second inner light extraction layer formed by dispersing the second scattering particles each having the second size in the resin.

The multi-buffer layer may have an alternately stacked structure of SiNx/SiNx, SiNx/SiOx, SiNx/SiON, SiOx/SiNx, or SiON/SiNx, or an alternately stacked structure of SiNx/SiNx/SiNx, SiNx/SiOx/SiNx, SiNx/SiON/SiNx, SiOx/SiNx/SiOx, or SiON/SiNx/SiON.

The multi-buffer layer may include a single layer of an inorganic film or an organic film, and the refractive index thereof may be gradually changed in the single layer.

The multi-buffer layer may have a stacked structure of three or more layers, an upper layer of the multi-buffer layer may be configured such that a refractive index thereof is close to the refractive index of the first electrode, and a lower layer of the multi-buffer layer may be configured such that a refractive index thereof is close to the refractive index of the inner light extraction layer.

Intermediate layers between the upper layer and the lower layer of the multi-buffer layer may be configured such that a refractive index thereof is gradually changed between the refractive index of the upper layer and the refractive index of the lower layer.

The lighting apparatus may further include an additional layer provided between the substrate and the inner light extraction layer, wherein the additional layer may be made of polyimide.

According to another aspect of the present disclosure, a lighting apparatus using an organic light-emitting diode includes an inner light extraction layer provided on a substrate, a multi-buffer layer provided on the inner light extraction layer, and a first electrode, an organic light-emitting layer, and a second electrode, which are provided in a lighting part of the substrate provided with the multi-buffer layer, wherein the multi-buffer layer is made of SiNx and is configured such that a refractive index thereof is gradually changed between a refractive index of the inner light extraction layer and a refractive index of the first electrode.

The inner light extraction layer may include a first inner light extraction layer formed by dispersing first scattering particles each having a first size and second scattering particles each having a second size smaller than the first size in a resin and a second inner light extraction layer formed by dispersing the second scattering particles each having the second size in the resin.

The multi-buffer layer may have a stacked structure of three or more layers, an upper layer of the multi-buffer layer may be configured such that a refractive index thereof is close to the refractive index of the first electrode, and a lower layer of the multi-buffer layer may be configured such that a refractive index thereof is close to the refractive index of the inner light extraction layer.

Intermediate layers between the upper layer and the lower layer of the multi-buffer layer may be configured such that a refractive index thereof is gradually changed between the refractive index of the upper layer and the refractive index of the lower layer.

The multi-buffer layer may include a single layer, and the refractive index thereof may be gradually changed in the single layer.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of aspects of the disclosure.

DETAILED DESCRIPTION

Figure 1:
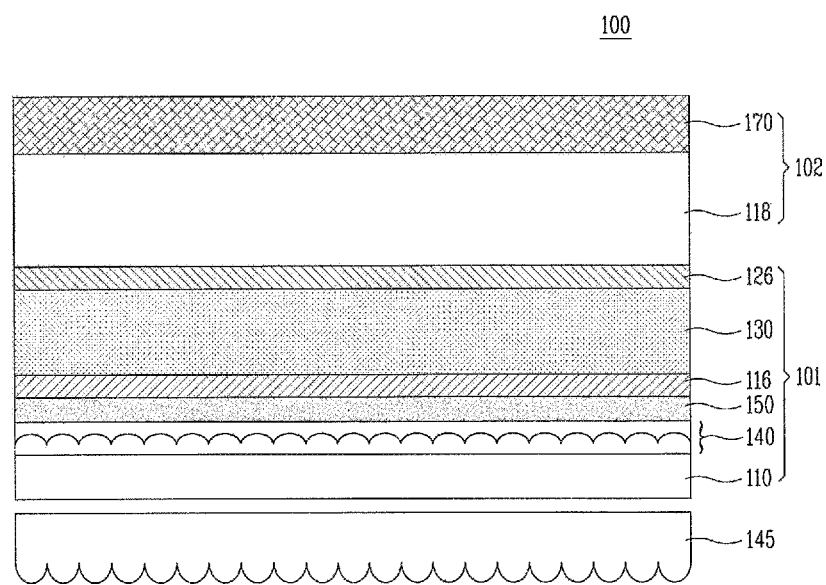
FIG. 1 is a cross-sectional view exemplarily showing a lighting apparatus using an organic light-emitting diode (OLED) according to an aspect of the present disclosure.

Hereinafter, exemplary aspects of a lighting apparatus using an organic light-emitting diode (OLED) according to the present disclosure will be described in detail with reference to the accompanying drawings for those skilled in the art to easily implement the present disclosure.

Advantages and features of the present disclosure and methods of accomplishing those may be understood more readily by reference to the following detailed description of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the disclosure will only be defined by the appended claims. Like reference numerals refer to like elements throughout the specification. In the drawings, the sizes and relative sizes of layers and regions may be exaggerated for clarity.

It will be understood that when an element or layer is referred to as being "on" another element or layer, the element or layer can be located directly on the other element or layer or intervening elements or layers may also be present. In contrast, when an element or layer is referred to as being "directly on" another element or layer, there are no intervening elements or layers present.

Spatially relative terms, such as "beneath," "below," "lower," "above," "upper" and the like, may be used herein to easily describe a correlation between one element or components and another element or other components as illustrated in the drawings. It will be understood that the spatially relative terms are intended to encompass different orientations of the element in use or operation in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

The terminology used herein is for the purpose of describing particular aspects only and is not intended to limit the present disclosure. As used herein, the singular forms "a", "an" and "the" are intended to include the plural forms as well, unless the context clearly indicates otherwise. It will be further understood that the terms "comprises", "comprising", "includes" and/or "including," if used herein, specify the presence of stated steps, operations, elements and/or components, but do not preclude the presence or addition of one or more other steps, operations, elements, components and/or groups thereof.

FIG. 1 is a cross-sectional view exemplarily showing a lighting apparatus 100 using an OLED according to an aspect of the present disclosure.

Figure 2:
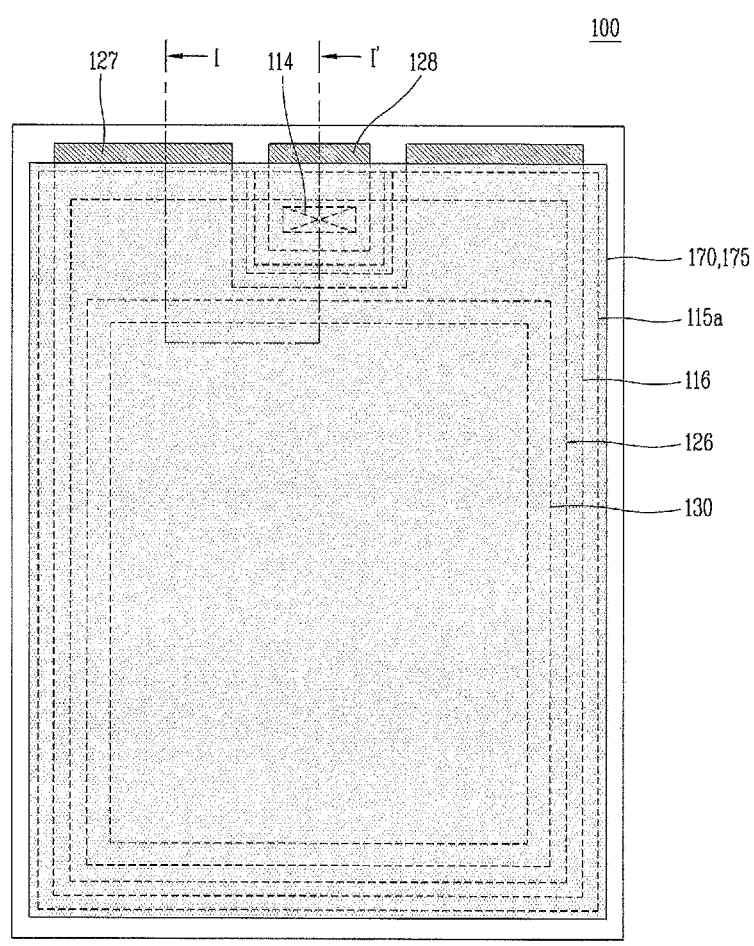
FIG. 2 is a schematic plan view showing a lighting apparatus using an OLED according to an aspect of the present disclosure.

FIG. 2 is a schematic plan view showing the lighting apparatus 100 using the OLED according to the aspect of the present disclosure.

Figure 3:
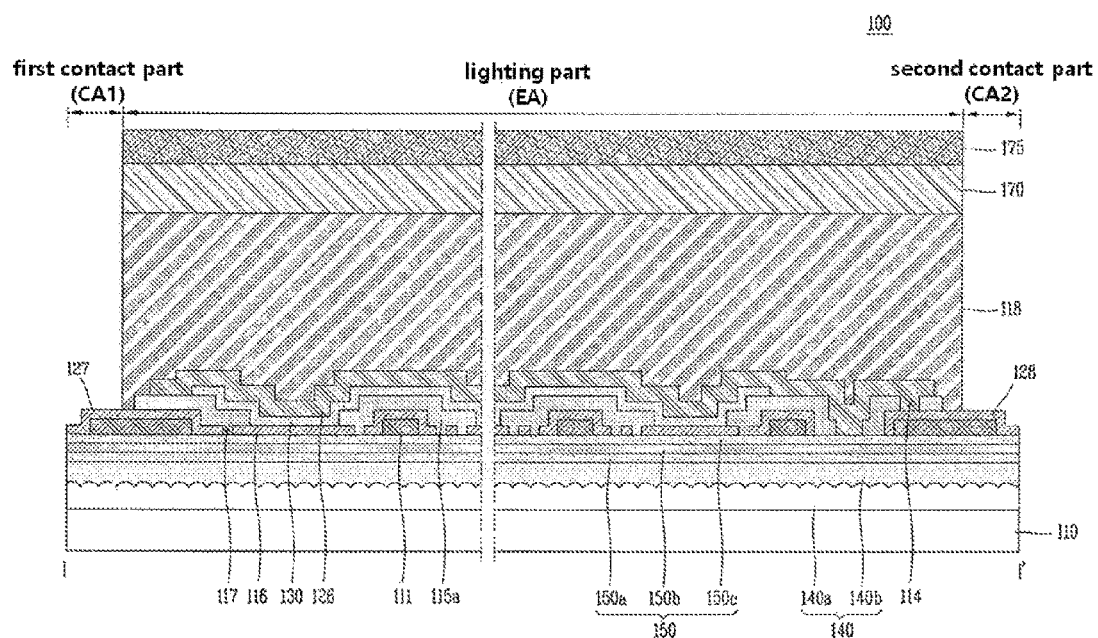
FIG. 3 is a schematic cross-sectional view taken along line I-I' of the lighting apparatus using the OLED according to the aspect of the present disclosure shown in FIG. 2.

FIG. 3 is a schematic cross-sectional view taken along line I-I' of the lighting apparatus 100 using the OLED according to the aspect of the present disclosure shown in FIG. 2.

Figure 4:
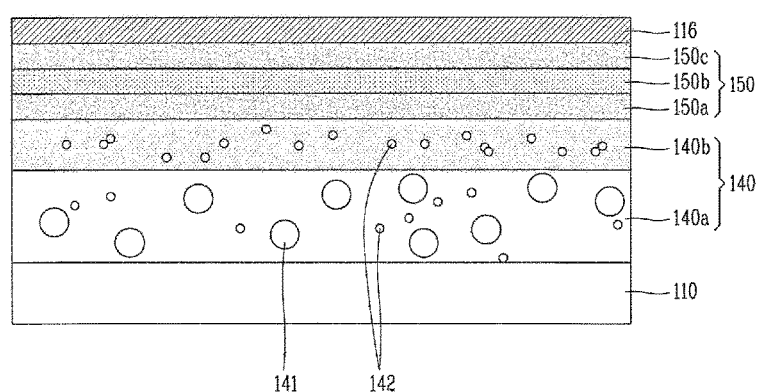
FIG. 4 is a cross-sectional view specifically showing a partial structure of the lighting apparatus using the OLED according to the aspect of the present disclosure shown in FIG. 3.

FIG. 4 is a cross-sectional view specifically showing a partial structure of the lighting apparatus 100 using the OLED according to the aspect of the present disclosure shown in FIG. 3. Structures of an inner light extraction layer 140 and a multi-buffer layer 150 are specifically shown as an example.

The present disclosure provides a lighting apparatus using an OLED made of an organic material rather than a lighting apparatus using an inorganic light-emitting diode made of an inorganic material.

An OLED made of an organic light-emitting material has relatively good luminous efficiency in green and red colors as compared with an inorganic light-emitting diode. In addition, since a width of an emission peak in red, green, and blue colors of the OLED is relatively greater than that of the inorganic light-emitting diode, a color rendering index (CRI) is improved. Accordingly, light of a light-emitting apparatus is more similar to the sunlight.

In the following description, the lighting apparatus 100 of the present disclosure will be described as being a flexible lighting apparatus having ductility. However, the present disclosure may be applied not only to the flexible lighting apparatus but also to a general nonflexible lighting apparatus.

Referring to FIGS. 1 to 4, the lighting apparatus 100 using the OLED according to the aspect of the present disclosure includes an OLED unit 101 configured to perform surface emission and an encapsulation portion 102 configured to encapsulate the OLED unit 101.

In this case, an outer light extraction layer 145 configured to increase a haze may be additionally provided on a lower portion of the OLED unit 101. However, the present disclosure is not limited thereto, and the outer light extraction layer 145 may not be provided.

The outer light extraction layer 145 may be formed by dispersing scattering particles of $TiO_2$ or the like in a resin and may be attached to a lower portion of a substrate 110 through an adhesive layer (not shown).

The OLED unit 101 includes an OLED provided on the substrate 110. In this case, the present disclosure is characterized in that the inner light extraction layer 140 is provided between the substrate 110 and the OLED.

The inner light extraction layer 140 may be formed by dispersing first and second scattering particles 141 and 142 of $TiO_2$, $ZrO_2$, and the like in a resin, but the present disclosure is not limited thereto.

In this case, the inner light extraction layer 140 may include a first inner light extraction layer 140a formed by dispersing the first and second scattering particles 141 and 142 in a resin and a second inner light extraction layer 140b formed by dispersing only the second scattering particles 142 in the resin. However, the present disclosure is not limited thereto.

The first scattering particles 141 may be scattering particles each having a size greater than that of each of the second scattering particles 142. For example, the first scattering particles 141 may be particles of $TiO_2$, and the second scattering particles 142 may be particles of $ZrO_2$. In this case, the second inner light extraction layer 140b may be considered as a planarization layer configured to planarize the first inner light extraction layer 140a.

The second inner light extraction layer 140b may be disposed on the first inner light extraction layer 140a.

In an example, the first inner light extraction layer 140a may have a thickness of about 5,000 Å, and the second inner light extraction layer 140b may have a thickness of about 2,000 Å.

A buffer layer (not shown) may be additionally provided on an upper portion of the inner light extraction layer 140.

In addition, the present disclosure is characterized in that a multi-buffer layer 150, of which a refractive index is gradually changed, is provided on the upper portion of the inner light extraction layer 140.

The above-described inner light extraction layer 140 may increase luminous efficiency by using a phenomenon in which light is scattered due to roughness of the first and second scattering particles 141 and 142. However, outgassing may be generated in the inner light extraction layer 140. In addition, since the first and second scattering particles 141 and 142 functioning as a scattering agent in the inner light extraction layer 140 each have a size of several tens of nanometers, the first and second scattering particles 141 and 142 are vulnerable to moisture.

Accordingly, the present disclosure is characterized in that the multi-buffer layer 150 is formed on the inner light extraction layer 140 to prevent degradation of the inner light extraction layer 140 caused by moisture transmission from the outside and to function as an outgassing barrier for the inner light extraction layer 140.

In this case, the multi-buffer layer 150 may have a stacked structure of three or more layers, i.e., a stacked structure of a lower buffer layer 150a, an intermediate buffer layer 150b, and an upper buffer layer 150c. However, the present disclosure is not limited thereto.

In an example, the multi-buffer layer 150 may have a three layer-stacked structure such as a stacked structure of SiNx/SiNx/SiNx, a stacked structure of SiNx/SiOx/SiNx, a stacked structure of SiNx/SiON/SiNx, a stacked structure of SiOx/SiNx/SiOx, or a stacked structure of SiON/SiNx/SiON. In addition, the multi-buffer layer 150 according to an aspect of the present disclosure may have an alternately stacked structure of SiNx/SiNx, SiNx/SiOx, SiNx/SiON, SiOx/SiNx, or SiON/SiNx.

However, the present disclosure is not limited thereto, and the multi-buffer layer 150 according to the aspect of the present disclosure may include a single layer of an inorganic film or an organic film. In this case, a refractive index may be gradually changed in the single layer.

In addition, according to the present disclosure, an optical loss due to Fresnel reflection and scattering can be minimized by adjusting a refractive index of the multi-buffer layer 150 at an OLED side to a refractive index of the OLED.

In an example, when a refractive index of the glass substrate 110 is 1.5, a refractive index of the inner light extraction layer 140 is in a range of 1.6 to 1.7, and a refractive index of each of a first electrode 116 and an organic light-emitting layer 130 is 1.8, the multi-buffer layer 150 of the present disclosure may be configured such that the refractive index thereof is gradually changed between a refractive index of an upper layer and a refractive index of a lower layer, i.e., between 1.7 and 1.8. In this case, for example, refractive indexes of the lower buffer layer 150a and the upper buffer layer 150c may be respectively 1.779 and 1.797, and a refractive index of the intermediate buffer layer 150b may be in a range between 1.779 and 1.797. However, the present disclosure is not limited thereto. As described above, the multi-buffer layer 150 of the present disclosure may be configured such that the refractive index thereof is gradually changed between the refractive index of the inner light extraction layer 140 and the refractive index of the first electrode 116. In addition, a multi-buffer layer at the OLED side, i.e., the upper buffer layer 150c may be configured such that the refractive index thereof is close to the refractive index of the OLED, i.e., the refractive index of the first electrode 116.

In an example, when the multi-buffer layer 150 includes SiNx/SiNx/SiNx/SiNx, external quantum efficiency (external QE) is about 47.4%. When the multi-buffer layer 150 includes SiNx/SiOx/SiNx/SiOx, SiNx/SiON/SiNx/SiON, SiOx/SiNx/SiOx/SiNx, or SiON/SiNx/SiON/SiNx, it can be seen that external QEs are about 45.5%, about 45.3%, about 44.9%, and about 45.0%, respectively. Therefore, when the multi-buffer layer 150 is applied, it can be seen that external QE of a stacked structure of SiNx/SiNx having a relatively high refractive index is increased, as compared with stacked structures of SiNx/SiOx and SiNx/SiON.

However, the present disclosure is not limited to such a stacked structure of inorganic films, and the multi-buffer layer 150 according to the aspect of the present disclosure may have a stacked structure of organic films.

Hereinafter, behavior of light in the lighting apparatus 100 using the OLED according to the aspect of the present disclosure will be described in detail in comparison with a comparative example not including an inner light extraction layer and a multi-buffer layer.

Figure 5:
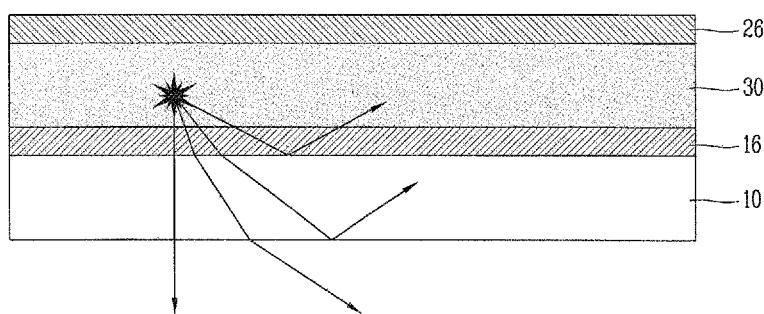
FIG. 5 is a view exemplarily showing behavior of light in a lighting apparatus using an OLED of a comparative example.

FIG. 5 is a view exemplarily showing behavior of light in a lighting apparatus using an OLED of the comparative example.

Figure 6A:
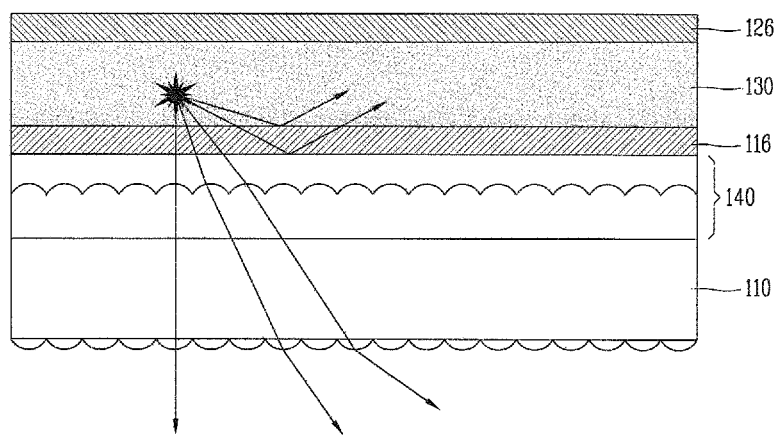
FIGS. 6A and 6B are views exemplarily showing behavior of light in a lighting apparatus using an OLED according to an aspect of the present disclosure.
Figure 6B:
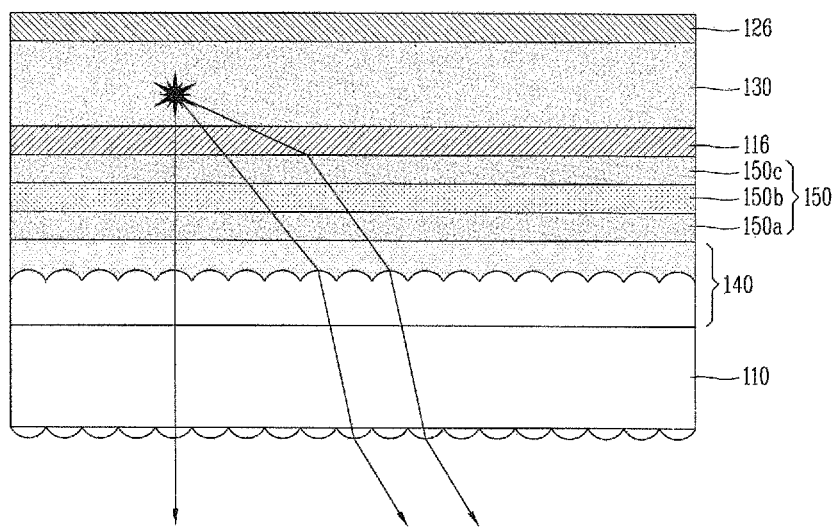

FIGS. 6A and 6B are views exemplarily showing behavior of light in the lighting apparatus 100 using the OLED according to the aspect of the present disclosure.

First, referring to FIG. 5, the lighting apparatus using the OLED of the comparative example includes an OLED which includes a first electrode 16 on an upper portion of a substrate 10, an organic light-emitting layer 30, and a second electrode 26.

In this case, a refractive index of the substrate 10 is 1.5, and a refractive index of each of the first electrode 16 and the organic light-emitting layer 30 is 1.8.

Light generated in the organic light-emitting layer 30 is emitted toward the substrate 10. A portion (about 10%) of the generated light disappears in a surface plasmon mode at the second electrode 26, a portion (about 40%) thereof is trapped in a waveguide mode at the first electrode 16 and the organic light-emitting layer 30, and a portion (about 10%) thereof is trapped in the thick glass substrate 10 by total internal reflection of a glass/air surface. Thus, only 20% of the generated light is emitted, resulting in a reduction in luminous efficiency.

In the case of the comparative example not including the inner light extraction layer and the multi-buffer layer, as a waveguide mode proceeds and disappears to a side surface at an interface, luminous efficiency is reduced.

On the other hand, referring to FIG. 6A, in the case of the aspect of the present disclosure including the inner light extraction layer 140, it can be seen that luminous efficiency is improved by using a phenomenon in which light is scattered due to roughness of scattering particles. That is, since the inner light extraction layer 140 having a nanostructure is provided at an interface between the substrate 110 and the first electrode 116, total internal reflection and a waveguide mode are reduced, so that light generated in the organic light-emitting layer 130 can be efficiently transferred to the atmosphere.

However, even in this case, a loss due to a refractive index difference may occur at interfaces between layers (i.e., an interface between the organic light-emitting layer 130 and the first electrode 116 and an interface between the first electrode 116 and the inner light extraction layer 140).

In addition, since scattering particles functioning as a scattering agent in the inner light extraction layer 140 each have a size of several tens of nanometers, the scattering particles are vulnerable to moisture.

Therefore, referring to FIG. 6B, the present disclosure is characterized in that the multi-buffer layer 150 is additionally formed on the inner light extraction layer 140 to prevent degradation of the inner light extraction layer 140 caused by moisture transmission from the outside and to function as an outgassing barrier for the inner light extraction layer 140.

In addition, the multi-buffer layer 150 of the present disclosure may be configured such that the refractive index thereof is changed between the refractive index of the inner light extraction layer 140 and the refractive index of the first electrode 116. The multi-buffer layer at the OLED side, i.e., the upper buffer layer 150c may be configured such that the refractive index thereof is close to the refractive index of the OLED, i.e., the refractive index of the first electrode 116, thereby preventing the loss due to the refractive index difference at the interface. That is, light generated in the organic light-emitting layer 130 may disappear or be trapped due to a refractive index difference between layers. When the multi-buffer layer 150 is formed on a lower portion of the first electrode 116 and concurrently, a refractive index difference is small between the first electrode 116 and the upper buffer layer 150c adjacent to the first electrode 116, light trapped in a waveguide mode can be extracted to the outside as much as possible.

In this case, the refractive index of the multi-buffer layer 150 can be gradually changed by changing deposition conditions such as a gas flow rate, a gas ratio, and pressure. This will be described in detail with reference to the following drawings.

FIGS. 7A to 7D are graphs exemplarily showing a change in a refractive index of a buffer layer according to a gas flow rate, pressure, and power. For example, SiNx is used as the buffer layer.

Figure 7A:
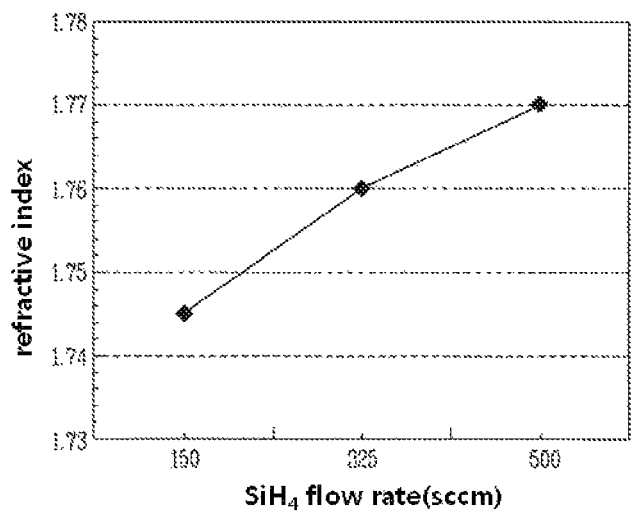
FIGS. 7A to 7D are graphs exemplarily showing a change in a refractive index of a buffer layer according to a gas flow rate, pressure, and power.
Figure 7B:
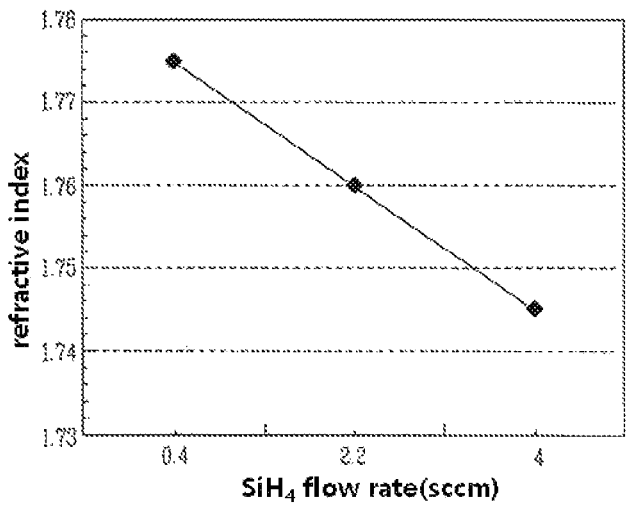
Figure 7C:
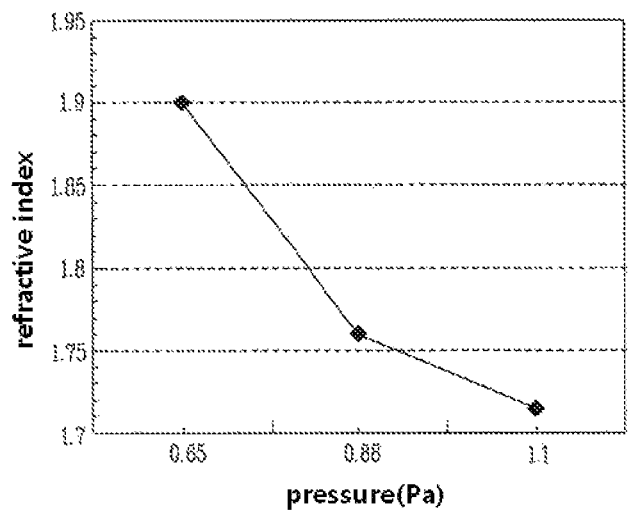
Figure 7D:
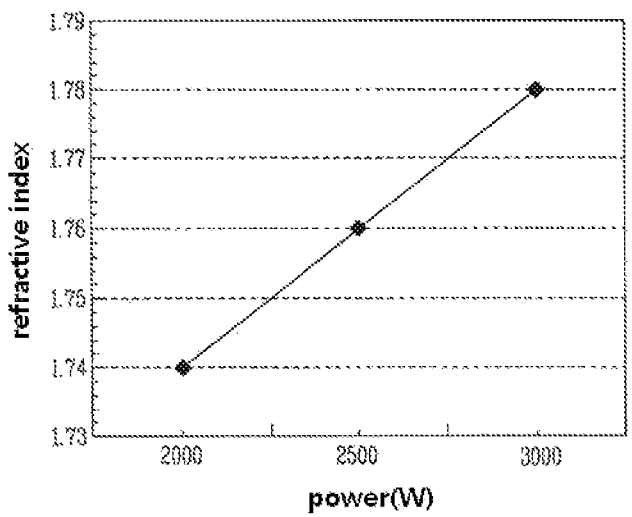

Here, FIG. 7A exemplarily shows a change in the refractive index of the buffer layer according to a flow rate of $SiH_4$, and FIG. 7B shows a change in the refractive index of the buffer layer according to a flow rate of $NH_3$. FIG. 7C exemplarily shows a change in the refractive index of the buffer layer according to pressure in a deposition apparatus, and FIG. 7D shows a change in the refractive index of the buffer layer according to power during deposition.

Referring to FIG. 7A, it can be seen that the refractive index of the buffer layer is increased as the flow rate of $SiH_4$ is increased. In an example, when the flow rate of $SiH_4$ is 150 sccm, the refractive index is 1.745, and it can be seen that when the flow rate of $SiH_4$ is increased to 325 sccm, the refractive index is increased to 1.76 and when the flow rate of $SiH_4$ is increased to 500 sccm, the refractive index is increased to 1.77.

In addition, referring to FIG. 7B, it can be seen that the refractive index of the buffer layer is decreased as the flow rate of $NH_3$ is increased. In an example, when the flow rate of $NH_3$ is 0.4 sccm, the refractive index is 1.775, and it can be seen that when the flow rate of $NH_3$ is increased to 2.2 sccm, the refractive index is decreased to 1.76 and when the flow rate of $NH_3$ is increased to 4.0 sccm, the refractive index is decreased to 1.745.

As described above, it can be seen that the refractive index of the buffer layer made of SiNx is adjusted according to a ratio of the gas flow rate of $SiH_4$ to the gas flow rate of $NH_3$, which are injected into the deposition apparatus.

Referring to FIG. 7C, it can be seen that the refractive index of the buffer layer is decreased as pressure in the deposition apparatus is increased. In an example, when the pressure is 0.65 Pa, the refractive index is 1.9, and it can be seen that when the pressure is increased to 0.88 Pa, the refractive index is rapidly decreased to 1.76 and when the pressure is increased to 1.1 Pa, the refractive index is rapidly decreased to 1.715.

In addition, referring to FIG. 7D, the refractive index of the buffer layer is increased as power is increased during deposition. In an example, when the power is 2,000 W, the refractive index is 1.74, and it can be seen that when the power is increased to 2,500 W, the refractive index is increased to 1.76 and when the power is increased to 3,000 W, the refractive index is increased to 1.78.

Referring again to FIGS. 1 to 4, the substrate 110 may include a lighting part EA configured to emit and output actual light to the outside and first and second contact parts CA1 and CA2 electrically connected to the outside through first and second contact electrodes 127 and 128 to apply a signal to the lighting part EA.

Since the first and second contact parts CA1 and CA2 are not covered by an encapsulation means of a metal film 170 and/or a protective film 175, the first and second contact parts CA1 and CA2 may be electrically connected to the outside through the first and second contact electrodes 127 and 128. Therefore, the metal film 170 and/or the protective film 175 may be attached to an entire surface of the lighting part EA of the substrate 110 except the first and second contact parts CA1 and CA2. However, the present disclosure is not limited thereto.

In this case, the first and second contact parts CA1 and CA2 may be located outside the lighting part EA. FIG. 3 exemplarily shows that the second contact part CA2 is located between the first contact parts CA1, but the present disclosure is not limited thereto.

In addition, FIG. 3 exemplarily shows that the first and second contact parts CA1 and CA2 are located only outside one side of the lighting part EA, but the present disclosure is not limited thereto. Therefore, the first and second contact parts CA1 and CA2 may be located outside both upper and lower sides of the lighting part EA.

The first electrode 116 and a second electrode 126 are disposed on an upper portion of the substrate 110, on which the multi-buffer layer 150 is provided. The organic light-emitting layer 130 may be disposed between the first electrode 116 and the second electrode 126 to form an OLED. As a current is applied to the first electrode 116 and the second electrode 126 of the OLED in the lighting apparatus 100 having such a structure, the organic light-emitting layer 130 emits and outputs light through the lighting part EA.

The organic light-emitting layer 130 may be a light-emitting layer which emits white light. In an example, the organic light-emitting layer 130 may include a blue light-emitting layer, a red light-emitting layer, and a green light-emitting layer or may have a tandem structure including a blue light-emitting layer and a yellow-green light-emitting layer. However, the organic light-emitting layer 130 of the present disclosure is not limited to the above-described structure and may have various structures.

In addition, the organic light-emitting layer 130 of the present disclosure may further include an electron injection layer configured to inject electrons into the light-emitting layers, a hole injection layer configured to inject holes into the light-emitting layers, an electron transport layer configured to transport the injected electrons to the light-emitting layers, a hole transport layer configured to transport the injected holes to the light-emitting layers, and a charge generation layer configured to generate charges such as electrons and holes.

Here, since a first passivation layer 115a, the organic light-emitting layer 130, and the second electrode 126 are not formed in the first and second contact parts CA1 and CA2 outside the lighting part EA, the first and second contact electrodes 127 and 128 may be exposed to the outside.

In this case, although not shown in drawings, a second passivation layer made of an organic material and a third passivation layer made of an inorganic material may be formed in the lighting part EA to cover the organic light-emitting layer 130 and the second electrode 126.

Generally, when a polymer constituting an organic light-emitting material is combined with moisture, light-emitting properties thereof are rapidly deteriorated, resulting in a reduction in luminous efficiency of the organic light-emitting layer 130. In particular, when a portion of the organic light-emitting layer 130 is exposed to the outside in the lighting apparatus 100, moisture is transmitted into the lighting apparatus 100 along the organic light-emitting layer 130, resulting in a reduction in luminous efficiency of the lighting apparatus 100. Thus, according to the present disclosure, the second passivation layer and the third passivation layer may be formed to cover the organic light-emitting layer 130 and the second electrode 126 of the lighting part EA, thereby preventing moisture from permeating the organic light-emitting layer 130 of the lighting part EA in the lighting apparatus 100, which emits and outputs actual light. Therefore, yield is improved to reduce manufacturing costs and secure reliability at the same time.

As described above, the first electrode 116 including the first contact electrode 127 and the second contact electrode 128 are disposed on the substrate 110 made of a transparent material. A hard material such as glass may be used as the substrate 110, and a material such as plastic having ductility may be used as the substrate 110 to manufacture the flexible lighting apparatus 100. In addition, in the present disclosure, since a plastic material having ductility is used as the substrate 110, a process using a roll can be performed to rapidly manufacture the lighting apparatus 100.

The first electrode 116 including the first contact electrode 127 and the second contact electrode 128 may be formed in the lighting part EA and the first and second contact parts CA1 and CA2 and may be made of a transparent conductive material having excellent conductivity and a high work function. In an example, in the present disclosure, the first electrode 116 including the first contact electrode 127 and the second contact electrode 128 may be made of a tin oxide-based conductive material such as indium tin oxide (ITO) or a zinc oxide-based conductive material such as indium zinc oxide (IZO) and may also be made of a transparent conductive polymer.

In this case, according to the present disclosure, a short reduction pattern 117 is formed on the first electrode 116 through which a current is supplied to each pixel, thereby reflecting a narrow path. The short reduction pattern 117 is covered with the first passivation layer 115a, thereby preventing a short circuit. That is, the short reduction pattern 117 is formed so as to surround an outer peripheral portion of an emission region of each pixel. Resistance is added to each pixel to limit a current flowing to a short circuit occurrence region.

The first electrode 116 may extend to the first contact part CA1 outside the lighting part EA to form the first contact electrode 127. The second contact electrode 128 electrically insulated from the first electrode 116 may be disposed in the second contact part CA2. That is, the second contact electrode 128 may be disposed in the same layer as the first electrode 116 and may be separated and electrically insulated from the first electrode 116.

In an example, FIG. 2 shows that the first electrode 116 including the first contact electrode 127 has an overall quadrangular shape, an upper central portion of the first electrode 116 is removed to form a recession, and the second contact electrode 128 is disposed in the recession, but the present disclosure is not limited thereto.

An auxiliary electrode 111 may be disposed in the lighting part EA and the first contact part CA1 of the substrate 110 and may be electrically connected to the first electrode 116 and the first contact electrode 127. The first electrode 116 is composed of a transparent high-resistance conductive film and advantageously transmits emitted light, but electrical resistance thereof is disadvantageously much higher than that of an opaque metal. Therefore, when the lighting apparatus 100 having a large area is manufactured, distribution of a current applied to a wide lighting region is non-uniform due to high resistance of the transparent high-resistance conductive film, and the non-uniform distribution of the current precludes the lighting apparatus 100 having the large area from emitting light having uniform luminance.

The auxiliary electrode 111 is disposed on an entire surface of the lighting part EA in a net shape, a mesh shape, a hexagonal shape, an octagonal shape, a circular shape, or the like, which has a thin width. The auxiliary electrode 111 allows a uniform current to be applied to the whole of the lighting part EA through the first electrode 116, thereby enabling the lighting apparatus 100 having the large area to emit light having uniform luminance.

In FIG. 3, the auxiliary electrode 111 is exemplarily illustrated as being disposed on the lower portion of the first electrode 116 including the first contact electrode 127, but the present disclosure is not limited thereto. Here, the auxiliary electrode 111 disposed in the first contact part CA1 may be used as a path for transferring a current to the first electrode 116 through the first contact electrode 127 and may function as a contact electrode which comes into contact with the outside to apply a current of the outside to the first electrode 116.

The auxiliary electrode 111 may be made of a metal having excellent conductivity, such as Al, Au, Cu, Ti, W, Mo, or an alloy thereof. The auxiliary electrode 111 may have a two-layered structure of an upper auxiliary electrode and a lower auxiliary electrode. However, the present disclosure is not limited thereto, and the auxiliary electrode 111 may have a single layered-structure.

The first passivation layer 115a may be stacked on the lighting part EA of the substrate 110. In FIG. 2, the first passivation layer 115a is illustrated as having a quadrangular frame shape having an overall certain width. Actually, the first passivation layer 115a may be removed from the emission region and may be formed in a net shape to cover the auxiliary electrode 111 disposed in the net shape. However, the present disclosure is not limited thereto.

The first passivation layer 115a disposed in the lighting part EA may be configured to cover the auxiliary electrode 111 and the first electrode 116 on the auxiliary electrode 111 but is not disposed in the emission region which emits actual light.

The first passivation layer 115a may be made of an inorganic material such as SiOx or SiNx. However, the first passivation layer 115a may be made of an organic material such as photoacryl and may include a plurality of layers of an inorganic material and an organic material.

The organic light-emitting layer 130 and the second electrode 126 may be disposed on the upper portion of the substrate 110, on which the first electrode 116 and the first passivation layer 115a are disposed. Here, a certain region of the first passivation layer 115a on an upper portion of the second contact electrode 128 disposed in the lighting part EA may be removed to provide a contact hole 114 configured to expose the second contact electrode 128. Thus, the second electrode 126 may be electrically connected to the second contact electrode 128 below the second electrode 126 through the contact hole 114.

As described above, the organic light-emitting layer 130 may be a white organic light-emitting layer. The organic light-emitting layer 130 may include the red light-emitting layer, the blue light-emitting layer, and the green light-emitting layer or may have the tandem structure including the blue light-emitting layer and the yellow-green light-emitting layer. In addition, the organic light-emitting layer 130 may include the electron injection layer configured to inject electrons into the light-emitting layers, the hole injection layer configured to inject holes into the light-emitting layers, the electron transport layer configured to transport the injected electrons to the light-emitting layers, the hole transport layer configured to transport the injected holes to the light-emitting layers, and the charge generation layer configured to generate charges such as electrons and holes.

A material having a small work function is desirably used as the second electrode 126 such that electrons are easily injected into the organic light-emitting layer 130. A specific example of a material used as the second electrode 126 may include one selected from metals such as magnesium, calcium, sodium, titanium, indium, yttrium, lithium, gadolinium, aluminum, silver, tin, and lead, or alloys thereof.

The first electrode 116, the organic light-emitting layer 130, and the second electrode 126 of the lighting part EA constitute an OLED. In this case, when the first electrode 116 is an anode of the OLED, the second electrode 126 is a cathode thereof, and when a current is applied to the first electrode 116 and the second electrode 126, electrons are injected from the second electrode 126 into the organic light-emitting layer 130, and holes are injected from the first electrode 116 into the organic light-emitting layer 130. Thereafter, excitons are generated in the organic light-emitting layer 130. As the excitons decay, light corresponding to an energy difference between a lowest unoccupied molecular orbital (LUMO) and a highest occupied molecular orbital (HOMO) is generated and emitted downwardly (toward the substrate 110 in drawings).

In this case, although not shown, the second passivation layer and the third passivation layer may be provided on the substrate 110 on which the second electrode 126 is formed.

As described above, the second passivation layer according to an aspect of the present disclosure may be formed to cover the organic light-emitting layer 130 and the second electrode 126 of the lighting part EA, thereby preventing moisture from permeating the organic light-emitting layer 130 of the lighting part EA.

That is, according to the present disclosure, in addition to an adhesive 118 and the encapsulation means of the metal film 170, the second passivation layer and the third passivation layer may be formed to cover the organic light-emitting layer 130 and the second electrode 126 of the lighting part EA, thereby preventing moisture from permeating the organic light-emitting layer 130 of the lighting part EA in the lighting apparatus 100, which emits and outputs actual light.

The second passivation layer may be made of an organic material such as photoacryl. In addition, the third passivation layer may be made of an inorganic material such as SiOx or SiNx. However, the present disclosure is not limited thereto.

A certain encapsulant may be provided on an upper portion of the third passivation layer. An epoxy-based compound, an acrylate-based compound, an acrylic-based compound, or the like may be used as the encapsulant.

As described above, the first contact electrode 127 extending from the first electrode 116 is exposed to the outside in the first contact part CA1 of the substrate 110. The second contact electrode 128 electrically connected to the second electrode 126 through the contact hole 114 is exposed to the outside in the second contact part CA 2 of the substrate 110. Therefore, the first contact electrode 127 and the second contact electrode 128 may be electrically connected to an external power supply to respectively apply currents to the first electrode 116 and the second electrode 126.

The third passivation layer may be coated with the adhesive 118 such as a pressure sensitive adhesive (PSA), and the metal film 170 may be disposed on the adhesive 118 and may be attached to the third passivation layer to seal the lighting apparatus 100.

In this case, the adhesive 118 and the encapsulation means of the metal film 170 may be attached to fully cover the second passivation layer and the third passivation layer.

The certain protective film 175 may be disposed on the metal film 170 so as to be attached to the entire surface of the lighting part EA of the substrate 110 except the first and second contact parts CA1 and CA2.

A photo-curable adhesive or a thermosetting adhesive may be used as the adhesive 118.

Hereinafter, a manufacturing method of a lighting apparatus using an OLED according to an aspect of the present disclosure will be described in detail with reference to the accompanying drawings.

FIGS. 8A to 8H are plan views sequentially showing a manufacturing method of the lighting apparatus using the OLED according to the aspect of the present disclosure shown in FIG. 2.

In addition, FIGS. 9A to 9H are cross-sectional views sequentially showing the manufacturing method of the lighting apparatus using the OLED according to the aspect of the present disclosure shown in FIG. 3.

Figure 8A:
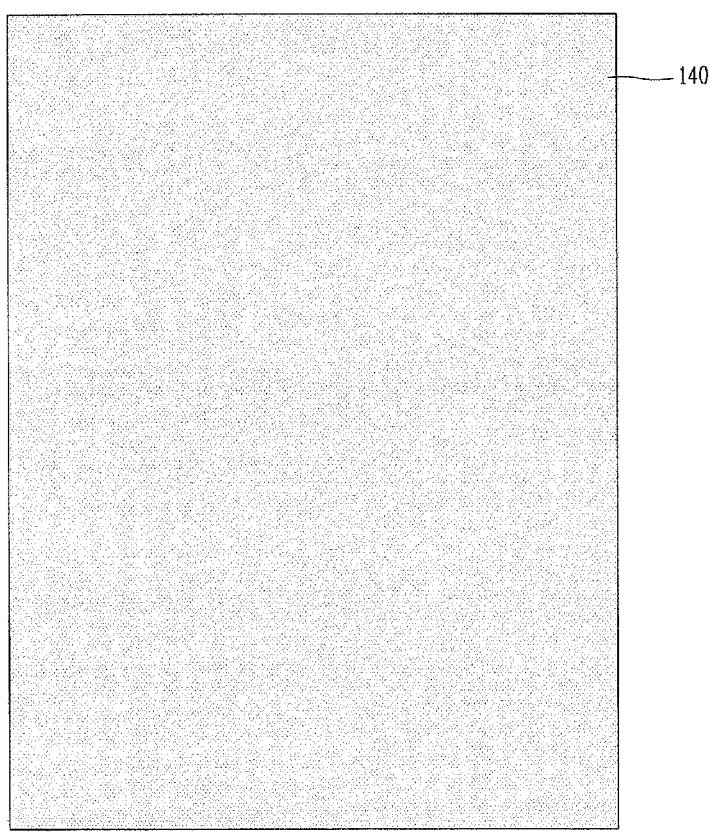
FIGS. 8A to 8H are plan views sequentially showing a manufacturing method of the lighting apparatus using the OLED according to the aspect of the present disclosure shown in FIG. 2.
Figure 8B:
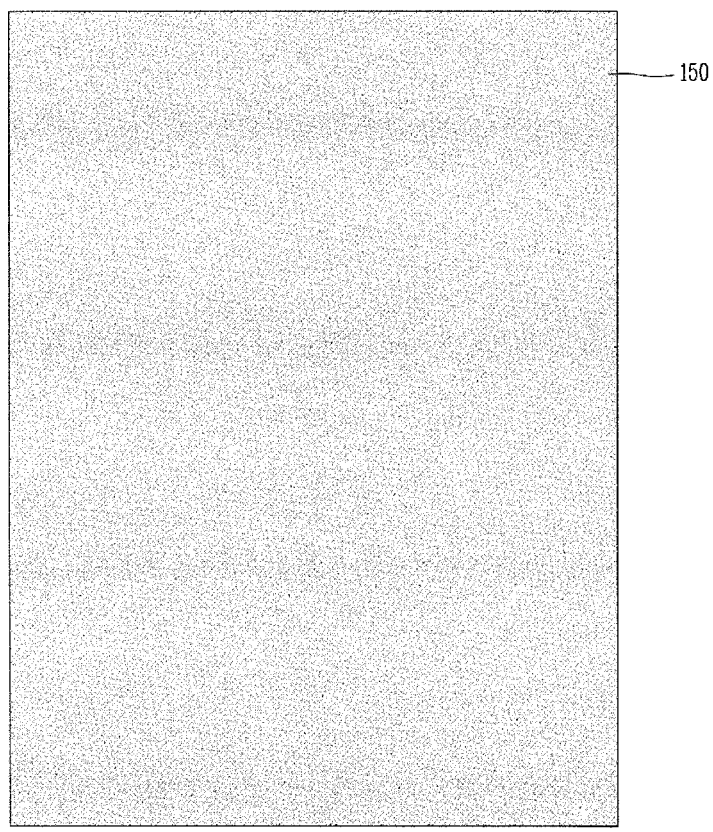
Figure 8C:
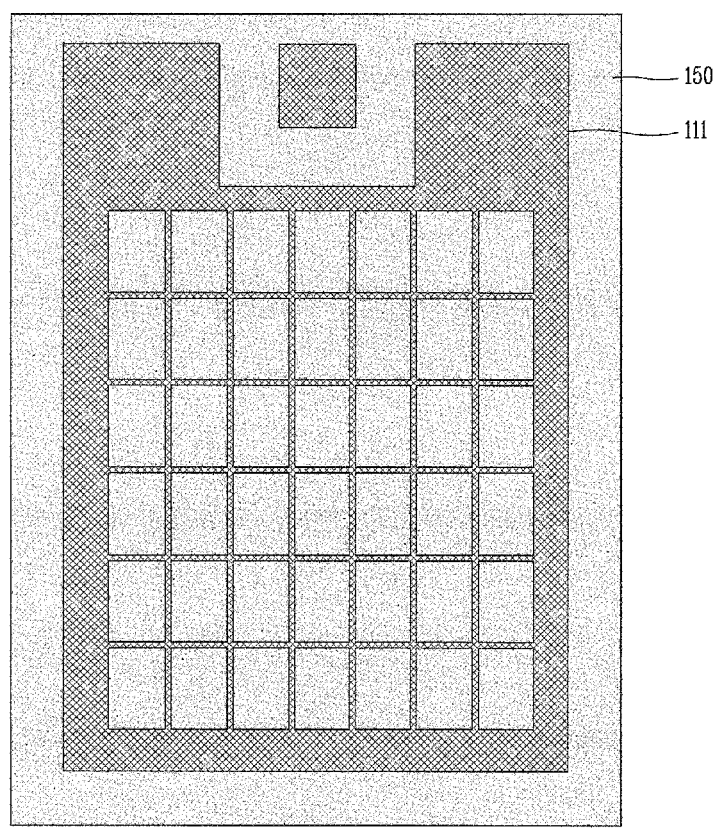
Figure 8D:
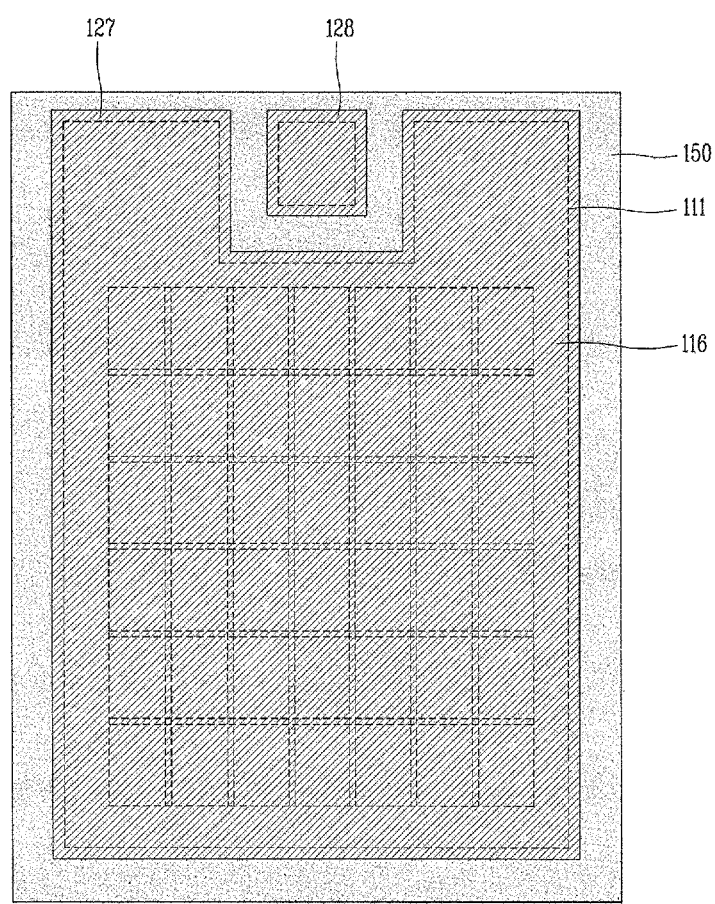
Figure 10:
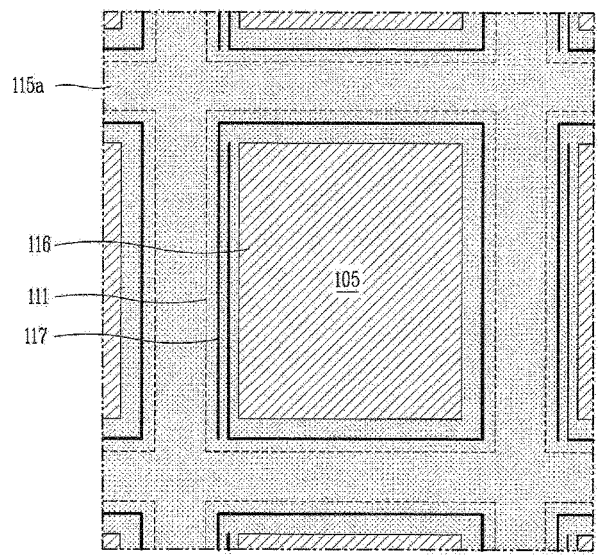
FIG. 10 is an enlarged view showing a portion of a lighting part shown in FIG. 8D.

FIG. 10 is an enlarged view showing a portion of a lighting part shown in FIG. 8D.

Figure 9A:
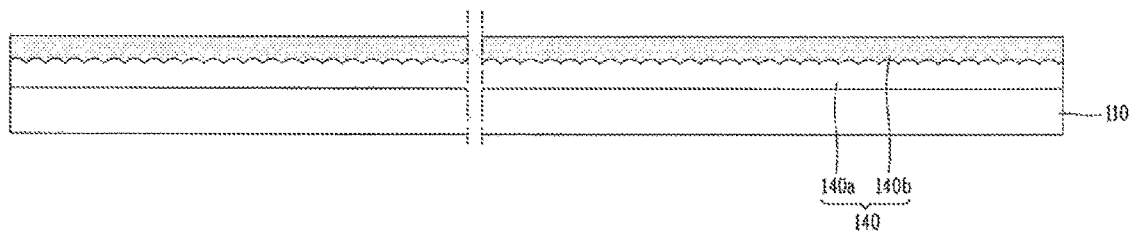
FIGS. 9A to 9H are cross-sectional views sequentially showing a manufacturing method of the lighting apparatus using the OLED according to the aspect of the present disclosure shown in FIG. 3.

First, referring to FIGS. 8A and 9A, the inner light extraction layer 140 is formed on an entire surface of the substrate 110.

In this case, the substrate 110 may include the lighting part EA configured to emit and output actual light to the outside and the first and second contact parts CA1 and CA2 configured to be electrically connected to the outside through the first and second contact electrodes 127 and 128 to apply a signal to the lighting part EA.

The inner light extraction layer 140 may be formed by dispersing scattering particles of $TiO_2$, $ZrO_2$, and the like in a resin, but the present disclosure is not limited thereto.

As described above, according to the aspect of the present disclosure, the inner light extraction layer 140 may include the first inner light extraction layer 140a formed by dispersing the first and second scattering particles 141 and 142 in the resin and the second inner light extraction layer 140b formed by dispersing only the second scattering particles 142 in the resin. The second inner light extraction layer 140b may be disposed on the first inner light extraction layer 140a. However, the present disclosure is not limited thereto.

The first scattering particles 141 may be scattering particles each having a size greater than that of each of the second scattering particles 142. In an example, the first scattering particles 141 may be particles of $TiO_2$, and the second scattering particles 142 may be particles of $ZrO_2$. In this case, the second inner light extraction layer 140b may be considered as a planarization layer configured to planarize the first inner light extraction layer 140a.

In an example, the first inner light extraction layer 140a may have a thickness of about 5,000 Å, and the second inner light extraction layer 140b may have a thickness of about 2,000 Å.

The buffer layer (not shown) may be additionally provided on the upper portion of the inner light extraction layer 140.

Figure 9B:
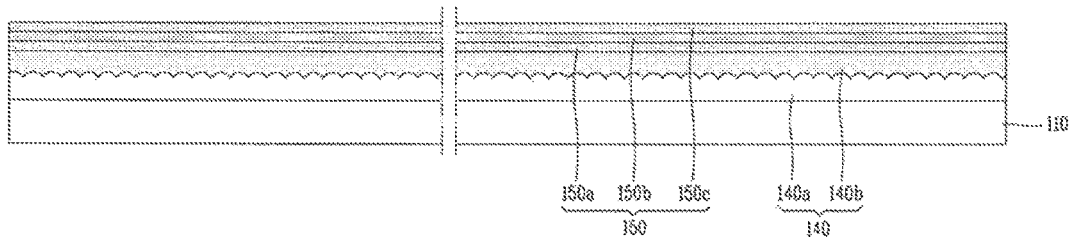

Next, referring to FIGS. 8B and 9B, the multi-buffer layer 150 having a multi-layered structure of three or more layers is formed on the inner light extraction layer 140.

In this case, according to the aspect of the present disclosure, the multi-buffer layer 150 is illustrated as an example in FIG. 9B as having a three-layer stacked structure of the lower buffer layer 150a, the intermediate buffer layer 150b, and the upper buffer layer 150c, but the present disclosure is not limited thereto.

In an example, the multi-buffer layer 150 may have a three-layer stacked structure such as a stacked structure of SiNx/SiNx/SiNx, a stacked structure of SiNx/SiOx/SiNx, a stacked structure of SiNx/SiON/SiNx, a stacked structure of SiOx/SiNx/SiOx, or a stacked structure of SiON/SiNx/SiON. In addition, the multi-buffer layer 150 may have an alternately stacked structure of SiNx/SiNx, SiNx/SiOx, SiNx/SiON, SiOx/SiNx, or SiON/SiNx.

However, the present disclosure is not limited to such a stacked structure of inorganic films, and the multi-buffer layer 150 according to the aspect of the present disclosure may have a stacked structure of organic films.

In addition, the present disclosure is not limited thereto, and the multi-buffer layer 150 according to the aspect of the present disclosure may include a single layer of an inorganic film or an organic film. In this case, a refractive index may be gradually changed in the single layer.

Furthermore, in an example, the multi-buffer layer 150 of the present disclosure is configured such that refractive indexes of the lower buffer layer 150a, the intermediate buffer layer 150b, and the upper buffer layer 150c are gradually changed between 1.7 and 1.8 in the three layer-stacked structure. However, the present disclosure is not limited thereto. As described above, the multi-buffer layer 150 of the present disclosure may be configured such that the refractive index thereof is gradually changed between the refractive index of the inner light extraction layer 140 and the refractive index of the first electrode 116. In addition, the multi-buffer layer at the OLED side, i.e., the upper buffer layer 150c may be configured such that the refractive index thereof is close to the refractive index of the OLED, i.e., the refractive index of the first electrode 116.

As described above, the refractive index of the multi-buffer layer 150 can be gradually changed by changing deposition conditions such as a gas flow rate, a gas ratio, and pressure.

Figure 9C:
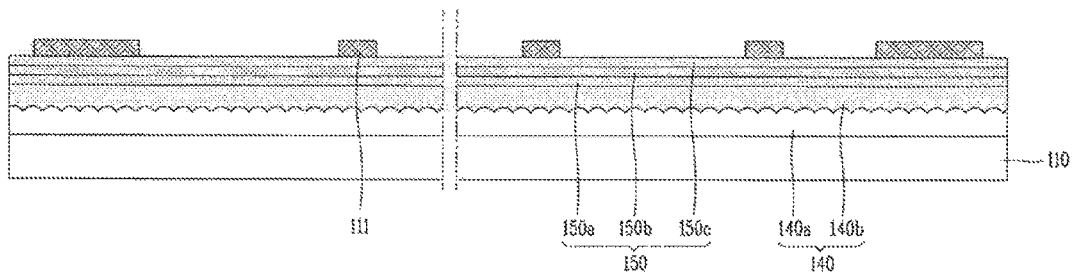

Referring to FIGS. 8C and 9C, the auxiliary electrode 111 including a single layer or a plurality of layers is formed in the lighting part EA and the first and second contact parts CA1 and CA2 by stacking and etching a metal such as Al, Au, Cu, Ti, W, Mo, or an alloy thereof on the substrate 110 divided into the lighting part EA and the first and second contact parts CA1 and CA2.

In addition, although not shown, the auxiliary electrode 111 may have the two-layered structure of the upper auxiliary electrode and the lower auxiliary electrode.

Furthermore, the auxiliary electrode 111 is disposed on the entire surface of the lighting part EA in a net shape (see FIG. 8B), a mesh shape, a hexagonal shape, an octagonal shape, a circular shape, or the like, which has a thin width. The auxiliary electrode 111 allows a uniform current to be applied to the whole of the lighting part EA through the first electrode 116, thereby enabling the lighting apparatus having the large area to emit light having uniform luminance.

Figure 9D:
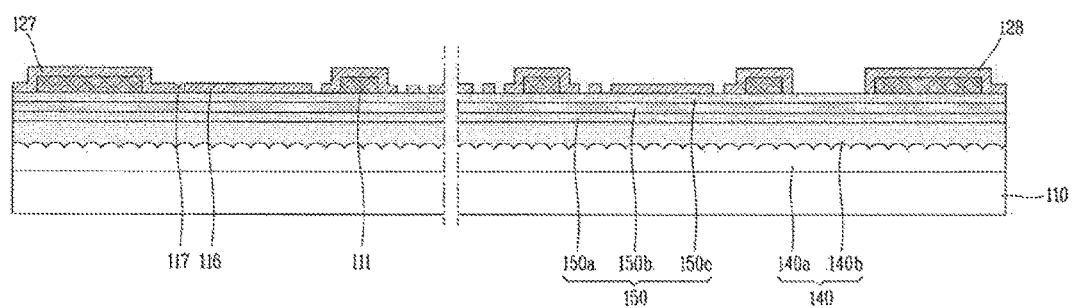

Referring to FIGS. 8D and 9D, the first electrode 116 including the first contact electrode 127 and the second contact electrode 128 are formed in the lighting part EA and the first and second contact parts CA1 and CA2 by stacking and etching a transparent conductive material such as ITO or IZO on the entire surface of the substrate 110.

In this case, the first electrode 116 may extend to the first contact part CA1 outside the lighting part EA to form the first contact electrode 127, and the second contact electrode 128 electrically insulated from the first electrode 116 may be formed at a portion of the lighting part EA and the second contact part CA2. That is, the second contact electrode 128 may be formed in the same layer as the first electrode 116 and may be separated and electrically insulated from the first electrode 116.

In an example, FIG. 8D exemplarily shows that the first electrode 116 including the first contact electrode 127 has an overall quadrangular shape, an upper central portion of the first electrode 116 is removed to form a recession, and the second contact electrode 128 is disposed in the recession, but the present disclosure is not limited thereto.

Here, the certain short reduction pattern 117 may be formed on the first electrode 116 at an inner edge of the emission region.

Figure 8E:
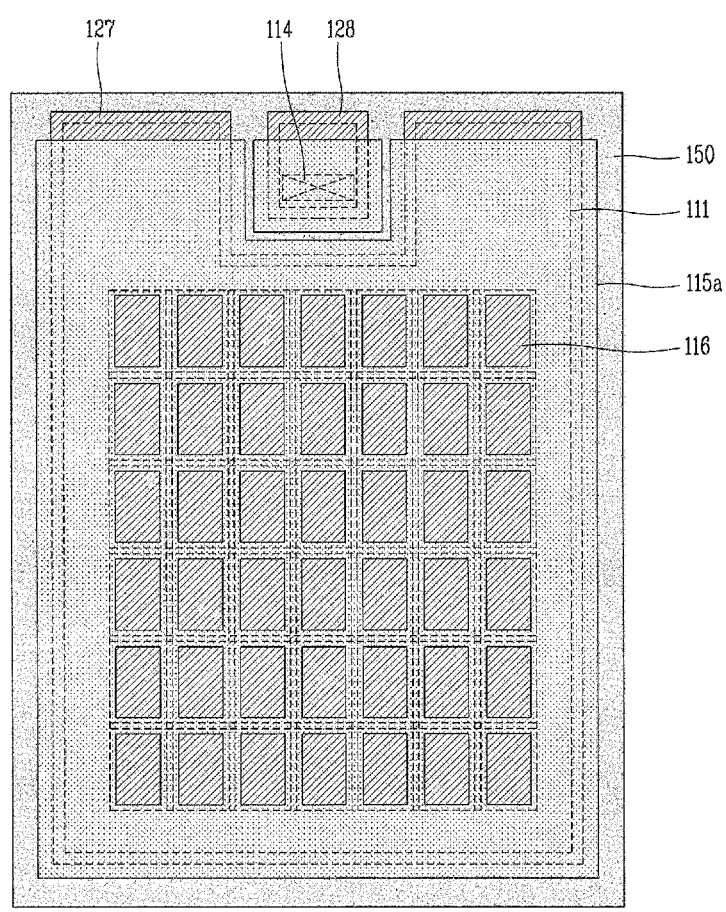
Figure 9E:
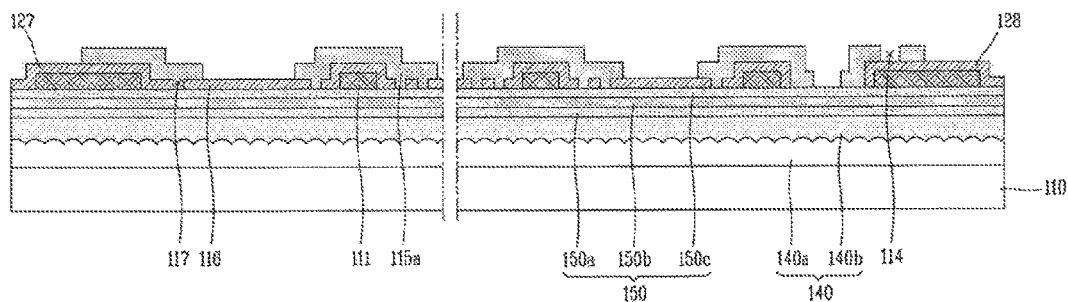

Referring to FIGS. 8E and 9E, an inorganic material such as SiNx or SiOx or an organic material such as photoacryl is stacked on the entire surface of the substrate 110. After that, the first passivation layer 115a is formed on an upper portion of the auxiliary electrode 111 of the lighting part EA and simultaneously the contact hole 114 configured to expose a portion of the second contact electrode 128 is formed by etching the inorganic material or the organic material.

In this case, the first passivation layer 115a is formed on an upper portion of the first electrode 116 so as to cover the auxiliary electrode 111 but is not disposed in the emission region which emits actual light (however, referring to FIG. 8E and FIG. 10, the first passivation layer 115a may be actually formed in a net shape at a center of the lighting part EA so as to cover the auxiliary electrode 111 disposed in a net shape). In FIG. 8E, the first passivation layer 115a may have a quadrangular frame shape having an overall certain width. As described above, the first passivation layer 115a may be actually formed in the net shape at the center of the lighting part EA so as to cover the auxiliary electrode 111 disposed in the net shape. In addition, the first passivation layer 115a on the upper portion of the first electrode 116 and the first passivation layer 115a on an upper portion of the second contact electrode 128 are illustrated as an example in FIG. 8E as being separated (disconnected) from each other, but the present disclosure is not limited thereto.

In this case, the first passivation layer 115a may also be formed in the short reduction pattern 117.

Referring to FIGS. 8F and 8G and FIGS. 9F and 9G, the organic light-emitting layer 130 made of an organic light-emitting material and the second electrode 126 made of a metal are respectively formed in the lighting part EA of the substrate 110.

Figure 8F:
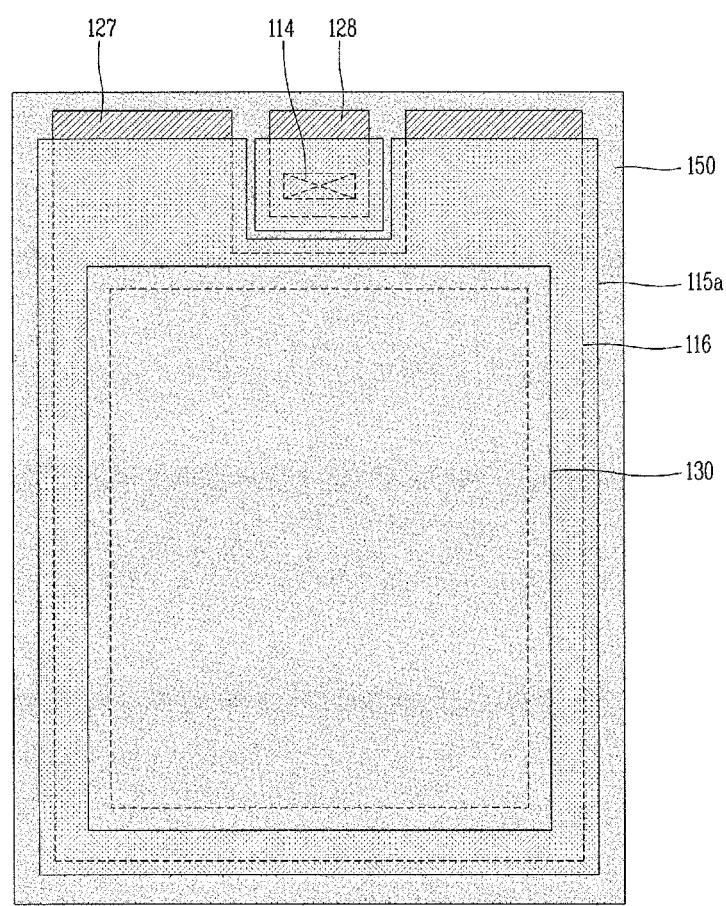
Figure 9F:
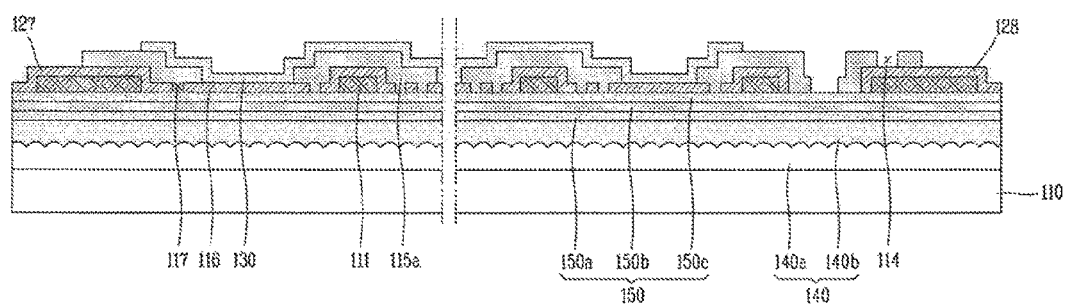

First, referring to FIGS. 8F and 9F, the organic light-emitting layer 130 made of an organic light-emitting material is formed in the lighting part EA of the substrate 110.

In this case, the organic light-emitting layer 130 may be the white organic light-emitting layer. The organic light-emitting layer 130 may include the red light-emitting layer, the blue light-emitting layer, and the green light-emitting layer or may have the tandem structure including the blue light-emitting layer and the yellow-green light-emitting layer. In addition, the organic light-emitting layer 130 may include the electron injection layer configured to inject electrons into the light-emitting layers, the hole injection layer configured to inject holes into the light-emitting layers, the electron transport layer configured to transport the injected electrons to the light-emitting layers, the hole transport layer configured to transport the injected holes to the light-emitting layers, and the charge generation layer configured to generate charges such as electrons and holes.

Figure 8G:
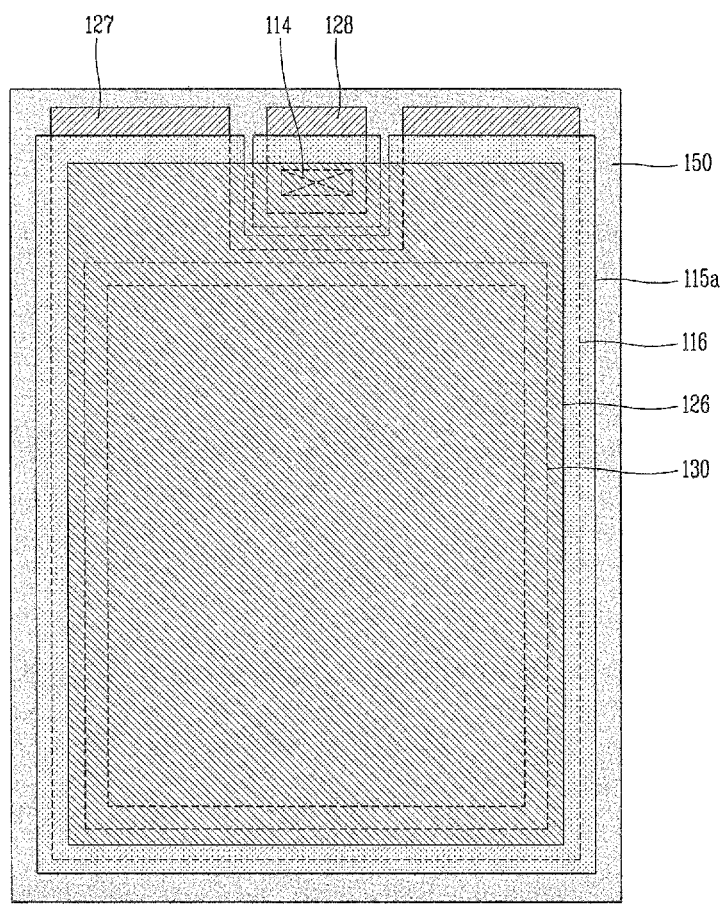
Figure 9G:
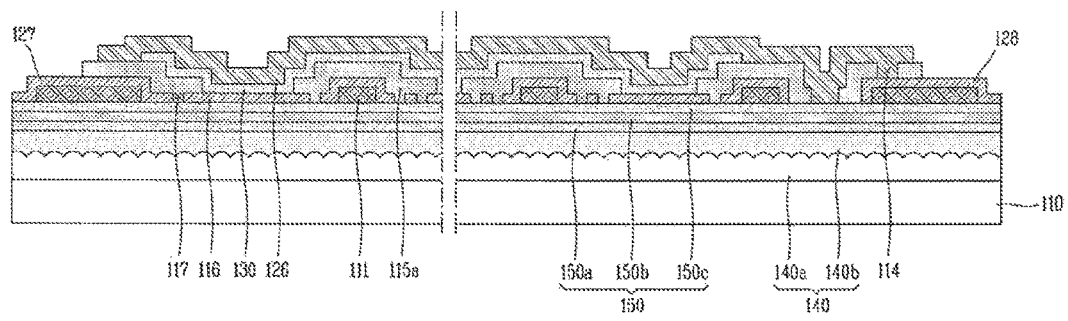

Next, referring to FIGS. 8G and 9G, the second electrode 126 made of a metal is formed in the lighting part EA of the substrate 110 so as to cover the organic light-emitting layer 130.

In this case, the second electrode 126 may be electrically connected to the second contact electrode 128 below the second electrode 126 through the contact hole 114.

The second electrode 126 may be made of one selected from metals such as magnesium, calcium, sodium, titanium, indium, yttrium, lithium, gadolinium, aluminum, silver, tin, and lead, or alloys thereof.

The first electrode 116, the organic light-emitting layer 130, and the second electrode 126 of the lighting part EA constitute an OLED.

In this case, since the first passivation layer 115a is disposed on the upper portion of the auxiliary electrode 111 of the lighting part EA, the organic light-emitting layer 130 on the upper portion of the auxiliary electrode 111 is not in direct contact with the first electrode 116. Thus, an OLED is not formed on the upper portion of the auxiliary electrode 111.

Next, although not shown, the second passivation layer made of an organic material may be formed in the lighting part EA of the substrate 110 so as to cover the organic light-emitting layer 130 and the second electrode 126.

In this case, as described above, the second passivation layer may be formed to cover the organic light-emitting layer 130 and the second electrode 126 of the lighting part EA, thereby preventing moisture from permeating the organic light-emitting layer 130 of the lighting part EA.

The organic light-emitting layer 130, the second electrode 126, and the second passivation layer may be formed in-line through a roll-manufacturing apparatus, but the present disclosure is not limited thereto.

Next, the third passivation layer may be formed in the lighting part EA of the substrate 110 so as to cover the second passivation layer.

The third passivation layer may be formed through another roll-manufacturing apparatus.

The third passivation layer may be made of an inorganic material such as SiOx or SiNx. However, the present disclosure is not limited thereto.

The certain encapsulant may be additionally provided on the upper portion of the third passivation layer. An epoxy-based compound, an acrylate-based compound, an acrylic-based compound, or the like may be used as the encapsulant.

Figure 8H:
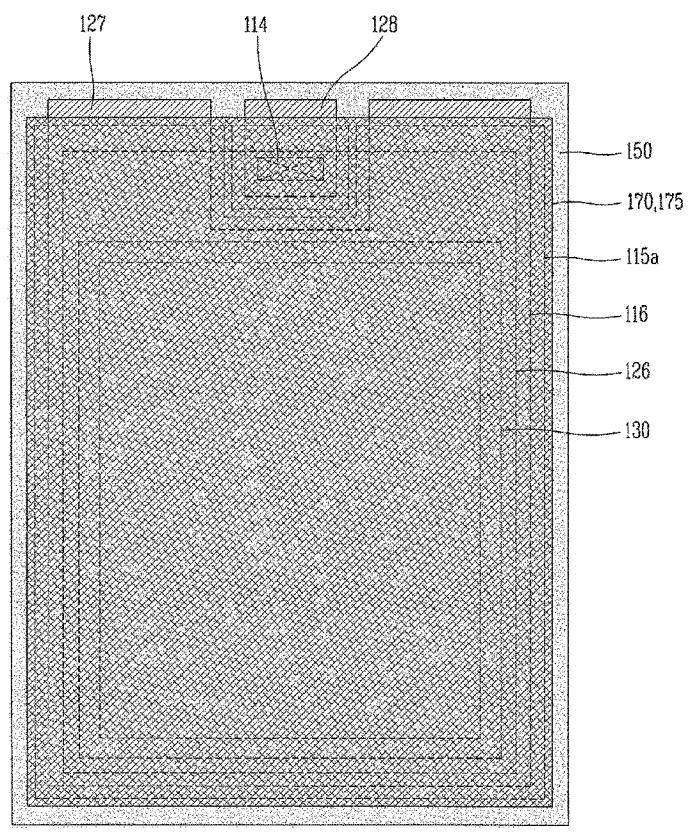
Figure 9H:
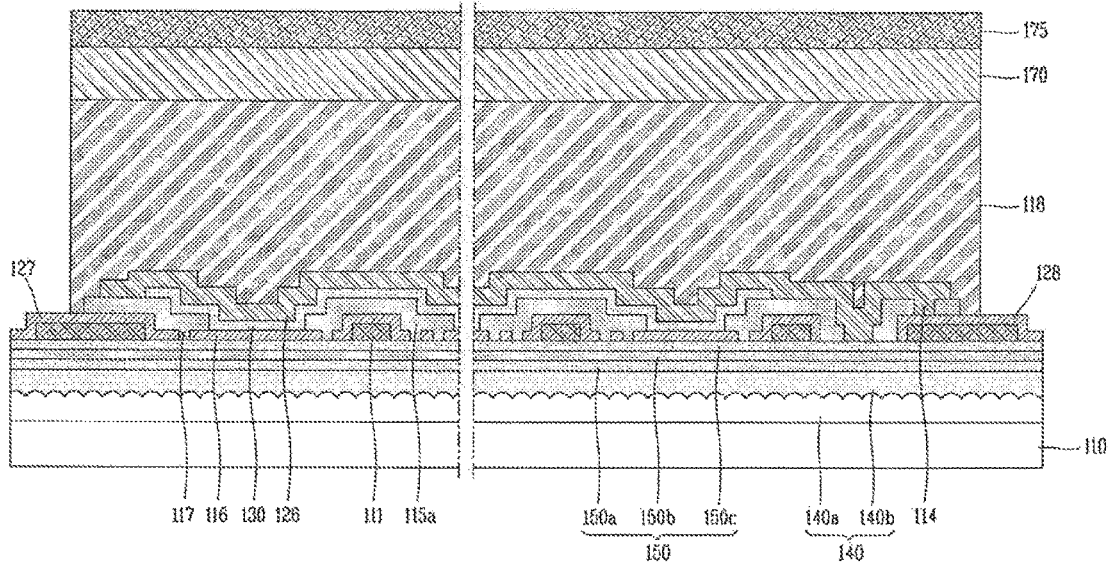

Next, referring to FIGS. 8H and 9H, the adhesive 118 made of a photo-curable adhesive material or a thermosetting adhesive material is applied on the lighting part EA of the substrate 110. The metal film 170 is placed on the adhesive 118 and then is attached by curing the adhesive 118.

In this case, since the first and second contact parts CA1 and CA2 are not covered with the encapsulation means of the metal film 170, the first and second contact parts CA1 and CA2 may be electrically connected to the outside through the first and second contact electrodes 127 and 128.

The lighting apparatus may be completed by attaching the certain protective film 175 to the entire surface of the lighting part EA of the substrate 110 except the first and second contact parts CA1 and CA2.

Meanwhile, an additional layer made of polyimide may be provided between the substrate 110 and the inner light extraction layer 140. This will be described in detail with reference to the drawings.

Figure 11:
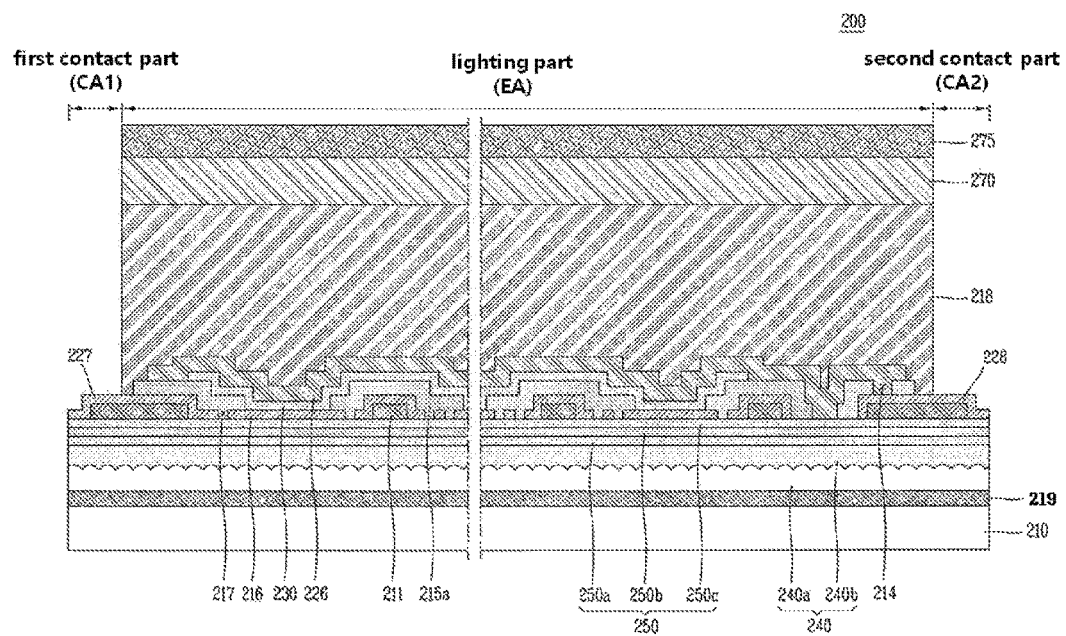
FIG. 11 is a schematic cross-sectional view showing a lighting apparatus using an OLED according to another aspect of the present disclosure.

FIG. 11 is a schematic cross-sectional view showing a lighting apparatus 200 using an OLED according to another aspect of the present disclosure.

In this case, the lighting apparatus 200 using the OLED according to another aspect of the present disclosure has substantially the same configuration as the above-described aspect of the present disclosure except that an additional layer 219 is provided between a substrate 210 and an inner light extraction layer 240.

That is, the lighting apparatus 200 using the OLED according to another aspect of the present disclosure includes an OLED unit configured to perform surface emission and an encapsulation portion configured to encapsulate the OLED unit.

In this case, an outer light extraction layer configured to increase a haze may be additionally provided on a lower portion of the OLED unit. However, the present disclosure is not limited thereto, and the outer light extraction layer may not be provided.

The outer light extraction layer may be formed by dispersing scattering particles of $TiO_2$ and the like in a resin and may be attached to a lower portion of the substrate 210 through an adhesive layer.

Referring to FIG. 11, the OLED unit includes an OLED provided on the substrate 210. In this case, the present disclosure is characterized in that the inner light extraction layer 240 is provided between the substrate 210 and the OLED.

In addition, the lighting apparatus 200 using the OLED according to another aspect of the present disclosure is characterized in that the additional layer 219 is provided between the substrate 210 and the inner light extraction layer 240.

The additional layer 219 may be made of polyimide.

The inner light extraction layer 240 may be formed by dispersing scattering particles (not shown) of $TiO_2$, $ZrO_2$, and the like in a resin, but the present disclosure is not limited thereto.

In this case, the inner light extraction layer 240 may include a first inner light extraction layer 240a formed by dispersing first and second scattering particles in a resin and a second inner light extraction layer 240b formed by dispersing only the second scattering particles in a resin. However, the present disclosure is not limited thereto.

The first scattering particles may be scattering particles each having a size greater than that of each of the second scattering particles. In an example, the first scattering particles may be particles of $TiO_2$, and the second scattering particles may be particles of $ZrO_2$. In this case, the second inner light extraction layer 240b may be considered as a planarization layer configured to planarize the first inner light extraction layer 240a.

The second inner light extraction layer 240b may be disposed on the first inner light extraction layer 240a.

In addition, the present disclosure is characterized in that a multi-buffer layer 250, of which a refractive index is gradually changed, is provided on an upper portion of the inner light extraction layer 240. That is, the present disclosure is characterized in that the multi-buffer layer 250 is formed on the inner light extraction layer 240 to prevent degradation of the inner light extraction layer 240 caused by moisture transmission from the outside and to function as an outgassing barrier for the inner light extraction layer 240.

In this case, the multi-buffer layer 250 may have a stacked structure of three or more layers, i.e., a stacked structure of a lower buffer layer 250a, an intermediate buffer layer 250b, and an upper buffer layer 250c.

In an example, the multi-buffer layer 250 may have a three layer-stacked structure such as a stacked structure of SiNx/SiNx/SiNx, a stacked structure of SiNx/SiOx/SiNx, a stacked structure of SiNx/SiON/SiNx, a stacked structure of SiOx/SiNx/SiOx, or a stacked structure of SiON/SiNx/SiON. The multi-buffer layer 250 may have a four layer-stacked structure such as a stacked structure of SiNx/SiNx/SiNx/SiNx, a stacked structure of SiNx/SiOx/SiNx/SiOx, a stacked structure of SiNx/SiON/SiNx/SiON, a stacked structure of SiOx/SiNx/SiOx/SiNx, or a stacked structure of SiON/SiNx/SiON/SiNx. That is, the multi-buffer layer 250 according to another aspect of the present disclosure may have an alternately stacked structure of SiNx/SiNx, SiNx/SiOx, SiNx/SiON, SiOx/SiNx, or SiON/SiNx.

However, the present disclosure is not limited to such a stacked structure of inorganic films, and the multi-buffer layer 250 according to another aspect of the present disclosure may have a stacked structure of organic films.

In addition, the present disclosure is not limited thereto, and the multi-buffer layer 250 according to another aspect of the present disclosure may include a single layer of an inorganic film or an organic film. In this case, a refractive index may be gradually changed in the single layer.

In addition, the multi-buffer layer 150 of the present disclosure may be configured such that a refractive index thereof is gradually changed between a refractive index of an upper layer and a refractive index of a lower layer, i.e., between 1.7 and 1.8. In this case, for example, refractive indexes of the lower buffer layer 250a and the upper buffer layer 250c may be respectively 1.779 and 1.797, and a refractive index of the intermediate buffer layer 250b may be in a range between 1.779 and 1.797. However, the present disclosure is not limited thereto. As described above, the multi-buffer layer 250 of the present disclosure may be configured such that the refractive index thereof is changed between a refractive index of the inner light extraction layer 240 and a refractive index of a first electrode 216. In addition, a multi-buffer layer at an OLED side, i.e., the upper buffer layer 250c may be configured such that the refractive index thereof is close to a refractive index of the OLED, i.e., the refractive index of the first electrode 116.

In this case, the substrate 210 may have a lighting part EA configured to emit and output actual light to the outside and first and second contact parts CA1 and CA2 electrically connected to the outside through first and second contact electrodes 227 and 228 to apply a signal to the lighting part EA.

Since the first and second contact parts CA1 and CA2 are not covered with an encapsulation means of a metal film 270 and/or a protective film 275, the first and second contact parts CA1 and CA2 may be electrically connected to the outside through the first and second contact electrodes 227 and 228. Therefore, the metal film 270 and/or the protective film 275 may be attached to an entire surface of the lighting part EA of the glass substrate 210 except the first and second contact parts CA1 and CA2. However, the present disclosure is not limited thereto.

The first electrode 216 and a second electrode 226 are disposed on an upper portion of the substrate 210, on which the multi-buffer layer 250 is provided. In addition, an organic light-emitting layer 230 may be disposed between the first electrode 216 and the second electrode 226 to form the OLED. As a current is applied to the first electrode 216 and the second electrode 226 of the OLED in the lighting apparatus 200 having such a structure, the organic light-emitting layer 230 emits and outputs light through the lighting part EA.

In this case, since a first passivation layer 215a, the organic light-emitting layer 230, and the second electrode 226 are not formed in the first and second contact parts CA1 and CA2 outside the lighting part EA, the first and second contact electrodes 227 and 228 may be exposed to the outside.

Here, although not shown, a second passivation layer made of an organic material and a third passivation layer made of an inorganic material may be formed in the lighting part EA so as to cover the organic light-emitting layer 230 and the second electrode 226.

According to the present disclosure, the second passivation layer and the third passivation layer may be formed to cover the organic light-emitting layer 230 and the second electrode 226 of the lighting part EA, thereby preventing moisture from permeating the organic light-emitting layer 230 of the lighting part EA in the lighting apparatus 200, which emits and outputs actual light. Therefore, yield is improved to reduce manufacturing costs and secure reliability at the same time.

As described above, the first electrode 216 which includes the first contact electrode 227, and the second contact electrode 228 are disposed on the substrate 210 made of a transparent material. A hard material such as glass may be used as the substrate 210, and a material such as plastic having ductility may be used as the substrate 210 to manufacture the flexible lighting apparatus 200. In addition, in the present disclosure, since a plastic material having ductility is used as the substrate 210, a process using a roll can be performed to rapidly manufacture the lighting apparatus 200.

The first electrode 216, which includes the first contact electrode 227, and the second contact electrode 228 may be formed in the lighting part EA and the first and second contact parts CA1 and CA2, and may be made of a transparent conductive material having excellent conductivity and a high work function. In an example, in the present disclosure, the first electrode 216, which includes the first contact electrode 227, and the second contact electrode 228 may be made of a tin oxide-based conductive material or a zinc oxide-based conductive material and may also be made of a transparent conductive polymer.

In this case, according to the present disclosure, a short reduction pattern 217 may be formed on the first electrode 216 through which a current is supplied to each pixel, thereby reflecting a narrow path. The short reduction pattern 217 may be covered with the first passivation layer 215a, thereby preventing a short circuit. That is, the short reduction pattern 217 is formed so as to surround an outer peripheral portion of an emission region of each pixel. Resistance is added to each pixel to limit a current flowing to a short circuit occurrence region.

The first electrode 216 may extend to the first contact part CA1 outside the lighting part EA to form the first contact electrode 227. The second contact electrode 228 electrically insulated from the first electrode 216 may be disposed in the second contact part CA2. That is, the second contact electrode 228 may be disposed in the same layer as the first electrode 216 and may be separated and electrically insulated from the first electrode 216.

An auxiliary electrode 211 may be disposed in the lighting part EA and the first contact part CA1 of the substrate 210 and may be electrically connected to the first electrode 216 and the first contact electrode 227. The first electrode 216 is composed of a transparent high-resistance conductive film and advantageously transmits emitted light, but electrical resistance thereof is disadvantageously much higher than that of an opaque metal. Therefore, when the lighting apparatus 200 having a large area is manufactured, distribution of a current applied to a wide lighting region is nonuniform due to high resistance of the transparent high-resistance conductive film, and the nonuniform distribution of the current precludes the lighting apparatus 200 having the large area from emitting light having uniform luminance.

The auxiliary electrode 211 is disposed on an entire surface of the lighting part EA in a net shape, a mesh shape, a hexagonal shape, an octagonal shape, a circular shape, or the like, which has a thin width. The auxiliary electrode 211 allows a uniform current to be applied to the whole of the lighting part EA through the first electrode 216, thereby enabling the lighting apparatus 200 having the large area to emit light having uniform luminance.

The auxiliary electrode 211 may be made of a metal having excellent conductivity, such as Al, Au, Cu, Ti, W, Mo, or an alloy thereof. The auxiliary electrode 211 may have a two-layered structure of an upper auxiliary electrode and a lower auxiliary electrode. However, the present disclosure is not limited thereto, and the auxiliary electrode 211 may have a single layered-structure.

The first passivation layer 215a may be stacked on the lighting part EA of the substrate 210.

The first passivation layer 215a disposed in the lighting part EA may be configured to cover the auxiliary electrode 211 and the first electrode 216 on the auxiliary electrode 211 but is not disposed in the emission region which emits actual light.

The first passivation layer 215a may be made of an inorganic material such as SiOx or SiNx. However, the first passivation layer 215a may be made of an organic material such as photoacryl and may include a plurality of layers of an inorganic material and an organic material.

The organic light-emitting layer 230 and the second electrode 226 may be disposed on the upper portion of the substrate 210, on which the first electrode 216 and the first passivation layer 215a are disposed. Here, a certain region of the first passivation layer 215a on an upper portion of the second contact electrode 228 disposed in the lighting part EA may be removed to provide a contact hole 214 configured to expose the second contact electrode 228. Thus, the second electrode 226 may be electrically connected to the second contact electrode 228 below the second electrode 226 through the contact hole 214.

The second electrode 226 is desirably made of a material having a small work function such that electrons are easily injected into the organic light-emitting layer 230. A specific example of a material used as the second electrode 226 may include one selected from metals such as magnesium, calcium, sodium, titanium, indium, yttrium, lithium, gadolinium, aluminum, silver, tin, and lead, or alloys thereof.

The first electrode 216, the organic light-emitting layer 230, and the second electrode 226 of the lighting part EA constitute an OLED.

In this case, although not shown, the second passivation layer and the third passivation layer may be provided on the substrates 210 on which the second electrode 226 is formed.

As described above, the second passivation layer according to another aspect of the present disclosure may be formed to cover the organic light-emitting layer 230 and the second electrode 226 of the lighting part EA, thereby preventing moisture from permeating the organic light-emitting layer 230 of the lighting part EA.

That is, according to the present disclosure, in addition to an adhesive 218 and the encapsulation means of the metal film 270, the second passivation layer and the third passivation layer may be formed to cover the organic light-emitting layer 230 and the second electrode 226 of the lighting part EA, thereby preventing moisture from permeating the organic light-emitting layer 230 of the lighting part EA in the lighting apparatus 200, which emits and outputs actual light.

The second passivation layer may be made of an organic material such as photoacryl. In addition, the third passivation layer may be made of an inorganic material such as SiOx or SiNx. However, the present disclosure is not limited thereto.

A certain encapsulant may be provided on an upper portion of the third passivation layer. An epoxy-based compound, an acrylate-based compound, an acrylic-based compound, or the like may be used as the encapsulant.

As described above, the first contact electrode 227 extending from the first electrode 216 is exposed to the outside in the first contact part CA1 of the substrate 210. The second contact electrode 228 electrically connected to the second electrode 226 through the contact hole 214 is exposed to the outside in the second contact part CA2 of the substrate 210. Therefore, the first contact electrode 227 and the second contact electrode 228 may be electrically connected to an external power supply to respectively apply currents to the first electrode 216 and the second electrode 226.

The third passivation layer may be coated with the adhesive 218 such as a pressure sensitive adhesive (PSA), and the metal film 270 may be disposed on the adhesive 118 and may be attached to the third passivation layer to seal the lighting apparatus 200.

In this case, the adhesive 218 and the encapsulation means of the metal film 270 may be attached to fully cover the second passivation layer and the third passivation layer.

The certain protective film 275 may be attached to the entire surface of the lighting part EA of the substrate 210 except the first and second contact parts CA1 and CA2.

A photo-curable adhesive or a thermosetting adhesive may be used as the adhesive 218.

As described above, according to a lighting apparatus using an OLED according to an aspect of the present disclosure, total internal reflection is reduced using light scattering by applying an inner light extraction layer, and a waveguide mode is reduced by applying a multi-buffer layer, thereby improving luminous efficiency.

In addition, the multi-buffer layer can be formed on the inner light extraction layer to prevent degradation of the inner light extraction layer caused by moisture transmission from the outside and to function as an outgassing barrier for the inner light extraction layer.

Furthermore, according to the lighting apparatus using the OLED according to the aspect of the present disclosure, an optical loss due to Fresnel reflection and scattering can be minimized by adjusting a refractive index of a multi-buffer layer at an OLED side to a refractive index of an OLED.

Although many subject matters have been specifically disclosed in the foregoing description, they should be construed as illustration of exemplary aspects rather than limitation of the scope of the present disclosure. Consequently, the present disclosure should not be determined by the aspects disclosed herein but should be determined by the claims and the equivalents thereof.

What is claimed is:

1. A lighting apparatus using an organic light-emitting diode, the lighting apparatus comprising:
   an inner light extraction layer disposed on a substrate;
   a multi-buffer layer disposed on the inner light extraction layer;
   a first electrode, an organic light-emitting layer, and a second electrode, which are disposed at a lighting part of the substrate; and
   an encapsulation layer encapsulating the lighting part of the substrate,
   wherein the multi-buffer layer has a refractive index gradually changed between a refractive index of the inner light extraction layer and a refractive index of the first electrode,
   wherein the multi-buffer layer has a stacked structure of at least three layers with an upper layer, a lower layer and an intermediate layer between the upper layer and the lower layer, and
   wherein the intermediate layer has a refractive index gradually changed between a refractive index of the upper layer and a refractive index of the lower layer.

2. The lighting apparatus of claim 1, wherein the first and second scattering particles are dispersed in resin and the second size is smaller than the first size.

3. The lighting apparatus of claim 2, wherein the first and second scattering particles are dispersed in resin and the second size is smaller than the first size.

4. The lighting apparatus of claim 1, wherein the multi-buffer layer includes an alternately stacked structure of inorganic layers.

5. The lighting apparatus of claim 4, wherein the inorganic layers include SiNx/SiNx, SiNx/SiOx, SiNx/SiON, SiOx/SiNx.

6. The lighting apparatus of claim 4, wherein the inorganic layers include SiNx/SiNx/SiNx, SiNx/SiOx/SiNx, SiNx/SiON/SiNx, SiOx/SiNx/SiOx, or SiON/SiNx/SiON.

7. The lighting apparatus of claim 1, wherein the multi-buffer layer includes a single layer of an inorganic film or an organic film.

8. The lighting apparatus of claim 7, wherein the single layer has a gradually changing refractive index with respect to a vertical direction.

9. The lighting apparatus of claim 1, wherein the upper layer has a refractive index close to the refractive index of the first electrode.

10. The lighting apparatus of claim 1, wherein the lower layer has a refractive index close to the refractive index of the inner light extraction layer.

11. The lighting apparatus of claim 1, further comprising an additional layer disposed between the substrate and the inner light extraction layer, wherein the additional layer includes polyimide.

12. A lighting apparatus using an organic light-emitting diode, the lighting apparatus comprising:
   an inner light extraction layer disposed on a substrate;
   a multi-buffer layer disposed on the inner light extraction layer;
   a first electrode, an organic light-emitting layer, and a second electrode, which are disposed at a lighting part of the substrate; and
   an encapsulation layer encapsulating the lighting part of the substrate, wherein the multi-buffer layer includes SiNx having a refractive index gradually changed between a refractive index of the inner light extraction layer and a refractive index of the first electrode, wherein the multi-buffer layer includes a stacked structure of at least three layers with an upper layer, a lower layer and an intermediate layer between the upper layer and the lower layer and wherein the intermediate layer has a refractive index gradually changed between the refractive index of the upper layer and the refractive index of the lower layer.

13. The lighting apparatus of claim 12, wherein the inner light extraction layer includes a first inner light extraction layer having first scattering particles each having a first size and second scattering particles each having a second size and a second inner light extraction layer having the second scattering particles each having the second size.

14. The lighting apparatus of claim 13, wherein the first and second scattering particles are dispersed in resin and the second size is smaller than the first size.

15. The lighting apparatus of claim 12, wherein the upper layer has a refractive index close to the refractive index of the first electrode, and the lower layer has a refractive index close to the refractive index of the inner light extraction layer.

16. The lighting apparatus of claim 12, wherein the multi-buffer layer includes a single layer having a gradually changing refractive index with respect to a vertical direction.

* * * * *